United States Patent
Do et al.

(10) Patent No.: US 11,404,811 B2
(45) Date of Patent: Aug. 2, 2022

(54) SMALL FORM FACTOR INTERPOSER

(71) Applicant: Amphenol Corporation, Wallingford, CT (US)

(72) Inventors: Trent K. Do, Lititz, PA (US); Paul R. Taylor, Mechanicsburg, PA (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 16/742,656

(22) Filed: Jan. 14, 2020

(65) Prior Publication Data
US 2020/0227850 A1 Jul. 16, 2020

Related U.S. Application Data

(60) Provisional application No. 62/850,381, filed on May 20, 2019, provisional application No. 62/792,222, filed on Jan. 14, 2019.

(51) Int. Cl.
*H01R 12/79* (2011.01)
*H01R 43/20* (2006.01)
(Continued)

(52) U.S. Cl.
CPC ......... *H01R 12/79* (2013.01); *H01R 13/2407* (2013.01); *H01R 43/20* (2013.01); *H01R 12/88* (2013.01)

(58) Field of Classification Search
CPC .... H01R 12/79; H01R 12/88; H01R 13/2407; H01R 43/20
(Continued)

(56) References Cited

U.S. PATENT DOCUMENTS 4,548,451 A * 10/1985 Benarr ............... H01R 12/714
                                                                                    29/848
5,139,427 A * 8/1992 Boyd ................. H01R 12/52
                                                                                    439/247
(Continued)

FOREIGN PATENT DOCUMENTS

EP         0903811 A1    3/1999
KR    10-1425931 B1   8/2014
(Continued)

OTHER PUBLICATIONS

International Search Report and Written Opinion for International Application No. PCT/US2020/013508 dated May 14, 2020.
(Continued)

*Primary Examiner* — Harshad C Patel
(74) *Attorney, Agent, or Firm* — Wolf, Greenfield & Sacks, P.C.

(57) ABSTRACT

A short, high density interposer. The interposer has multiple contacts, with upwards and downwards-facing contact surfaces. Each of the contacts may be formed as a beam stamped from a sheet of metal. Two sheets of metal may be used in forming the interposer. A first sheet may be stamped with upwards facing contacts. A second sheet may be stamped with downwards facing contacts. Bases of the beams on the first sheet may be fused with bases of the beams on the second sheet, creating a conducting path through the interposer, with compliant contacts at each end. The joined contacts may be separated from the sheets from which they are stamped and held together with an insulative base of the interposer. Beams shaped to form contacts in the interposer may be closely spaced when stamped in a sheet of metal and may have a low height.

20 Claims, 18 Drawing Sheets

(51) Int. Cl.
*H01R 13/24* (2006.01)
*H01R 12/88* (2011.01)

(58) Field of Classification Search
USPC .............................................. 439/66, 74, 82
See application file for complete search history.

(56) References Cited

U.S. PATENT DOCUMENTS

| | | | | |
|---|---|---|---|---|
| 5,308,252 | A * | 5/1994 | Mroczkowski | H01R 13/2435 |
| | | | | 439/591 |
| 5,358,411 | A * | 10/1994 | Mroczkowski | H01R 13/2435 |
| | | | | 439/66 |
| 5,484,295 | A | 1/1996 | Mowry | |
| 5,498,166 | A * | 3/1996 | Rothenberger | H01R 13/5202 |
| | | | | 439/66 |
| 5,653,598 | A | 8/1997 | Grabbe | |
| 6,029,344 | A * | 2/2000 | Khandros | B23K 20/004 |
| | | | | 29/874 |
| 6,042,387 | A * | 3/2000 | Jonaidi | H01R 13/2407 |
| | | | | 439/66 |
| 6,068,514 | A * | 5/2000 | Zuin | G06K 7/0021 |
| | | | | 439/630 |
| 6,077,089 | A * | 6/2000 | Bishop | H01R 12/714 |
| | | | | 439/296 |
| 6,146,151 | A * | 11/2000 | Li | H01R 13/2414 |
| | | | | 439/66 |
| 6,345,987 | B1 * | 2/2002 | Mori | H01R 13/2435 |
| | | | | 439/66 |
| 6,474,997 | B1 | 11/2002 | Ochiai | |
| 6,843,659 | B2 * | 1/2005 | Liao | H01R 13/2435 |
| | | | | 439/66 |
| 6,877,992 | B2 * | 4/2005 | Grant | H01R 13/2435 |
| | | | | 439/591 |
| 6,893,270 | B2 | 5/2005 | Sercu | |
| 6,905,343 | B1 | 6/2005 | Neidich | |
| 6,916,181 | B2 * | 7/2005 | Brown | H01L 24/72 |
| | | | | 257/E23.078 |
| 7,025,601 | B2 * | 4/2006 | Dittmann | H01R 13/2407 |
| | | | | 439/66 |
| 7,090,503 | B2 | 8/2006 | Dittmann | |
| 7,128,580 | B2 * | 10/2006 | Liao | H01R 13/2435 |
| | | | | 439/71 |
| 7,179,126 | B2 * | 2/2007 | Chen | H01R 9/226 |
| | | | | 439/607.35 |
| 7,396,236 | B2 * | 7/2008 | Eldridge | G01R 1/07307 |
| | | | | 324/750.05 |
| 7,628,617 | B2 * | 12/2009 | Brown | H01R 13/2407 |
| | | | | 439/66 |
| 7,649,368 | B2 * | 1/2010 | Eldridge | G01R 1/07378 |
| | | | | 324/754.18 |
| 7,722,398 | B2 * | 5/2010 | Ma | H01R 13/6583 |
| | | | | 439/607.04 |
| 7,766,668 | B1 * | 8/2010 | Bishop | H01R 12/718 |
| | | | | 439/66 |
| 8,780,581 | B2 * | 7/2014 | Merz | H01Q 9/42 |
| | | | | 361/799 |
| 9,172,161 | B2 * | 10/2015 | Walden | H01R 13/2435 |
| 9,337,585 | B1 | 5/2016 | Yang | |
| 9,425,525 | B2 | 8/2016 | Walden et al. | |
| 9,680,273 | B2 * | 6/2017 | Light | H01R 12/7082 |
| 10,116,080 | B1 | 10/2018 | Ju et al. | |
| 10,135,199 | B1 | 11/2018 | Ju | |
| 10,148,024 | B2 | 12/2018 | Ju et al. | |
| 10,716,213 | B2 * | 7/2020 | Kim | H05K 1/117 |
| 2003/0003779 | A1 * | 1/2003 | Rathburn | H01R 12/62 |
| | | | | 439/66 |
| 2004/0127073 | A1 * | 7/2004 | Ochiai | H01R 43/16 |
| | | | | 439/66 |
| 2004/0157476 | A1 * | 8/2004 | Maldonado | H01R 13/5202 |
| | | | | 439/66 |
| 2004/0252477 | A1 | 12/2004 | Brown et al. | |
| 2005/0153600 | A1 * | 7/2005 | Lu | H01R 12/716 |
| | | | | 439/607.2 |
| 2005/0170674 | A1 * | 8/2005 | Lu | H01R 13/2442 |
| | | | | 439/66 |
| 2005/0208786 | A1 | 9/2005 | Dittmann | |
| 2005/0208787 | A1 | 9/2005 | Dittmann | |
| 2005/0208788 | A1 * | 9/2005 | Dittmann | H01R 13/2407 |
| | | | | 439/66 |
| 2006/0024987 | A1 * | 2/2006 | Huang | H01R 13/2435 |
| | | | | 439/66 |
| 2006/0063431 | A1 * | 3/2006 | Yang | H01R 13/6582 |
| | | | | 439/71 |
| 2006/0105631 | A1 * | 5/2006 | Yang | H01R 12/716 |
| | | | | 439/71 |
| 2007/0054515 | A1 * | 3/2007 | Williams | H01R 13/245 |
| | | | | 439/74 |
| 2007/0075717 | A1 | 4/2007 | Kinghorn et al. | |
| 2009/0134895 | A1 | 5/2009 | Miller | |
| 2013/0143420 | A1 * | 6/2013 | Light | H05K 1/115 |
| | | | | 439/65 |
| 2013/0237092 | A1 | 9/2013 | Rubens | |
| 2014/0273641 | A1 * | 9/2014 | Light | H01R 12/7082 |
| | | | | 439/625 |
| 2015/0072562 | A1 | 3/2015 | Litle et al. | |
| 2015/0147895 | A1 | 5/2015 | Hanna | |
| 2015/0333460 | A1 | 11/2015 | Regnier et al. | |
| 2017/0194721 | A1 * | 7/2017 | Fan | H01R 12/52 |
| 2018/0026413 | A1 | 1/2018 | Dambach et al. | |

FOREIGN PATENT DOCUMENTS

WO  WO 2005/048409 A1  5/2005
WO  WO 2014/146134 A1  9/2014

OTHER PUBLICATIONS

International Search Report and Written Opinion for International Application No. PCT/US2020/013487 dated Jun. 8, 2020.
Do, Midboard Cable Terminology Assembly, U.S. Appl. No. 16/742,596, filed Jan. 14, 2020.
U.S. Appl. No. 16/742,596, filed Jan. 14, 2020, Do.
PCT/US2020/013487, Jun. 8, 2020, International Search Report and Written Opinion.
PCT/US2020/013508, May 14, 2020, International Search Report and Written Opinion.

* cited by examiner

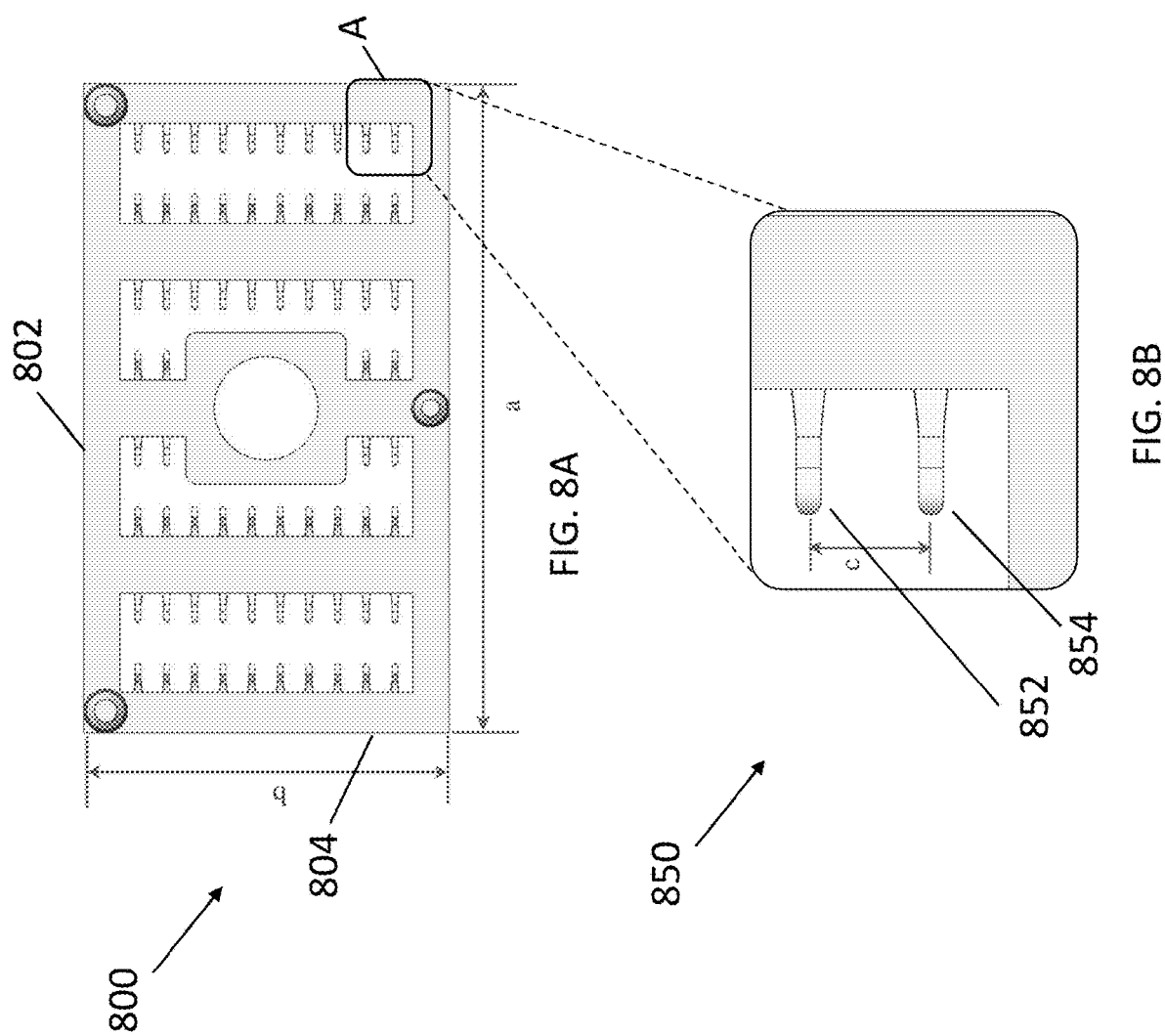

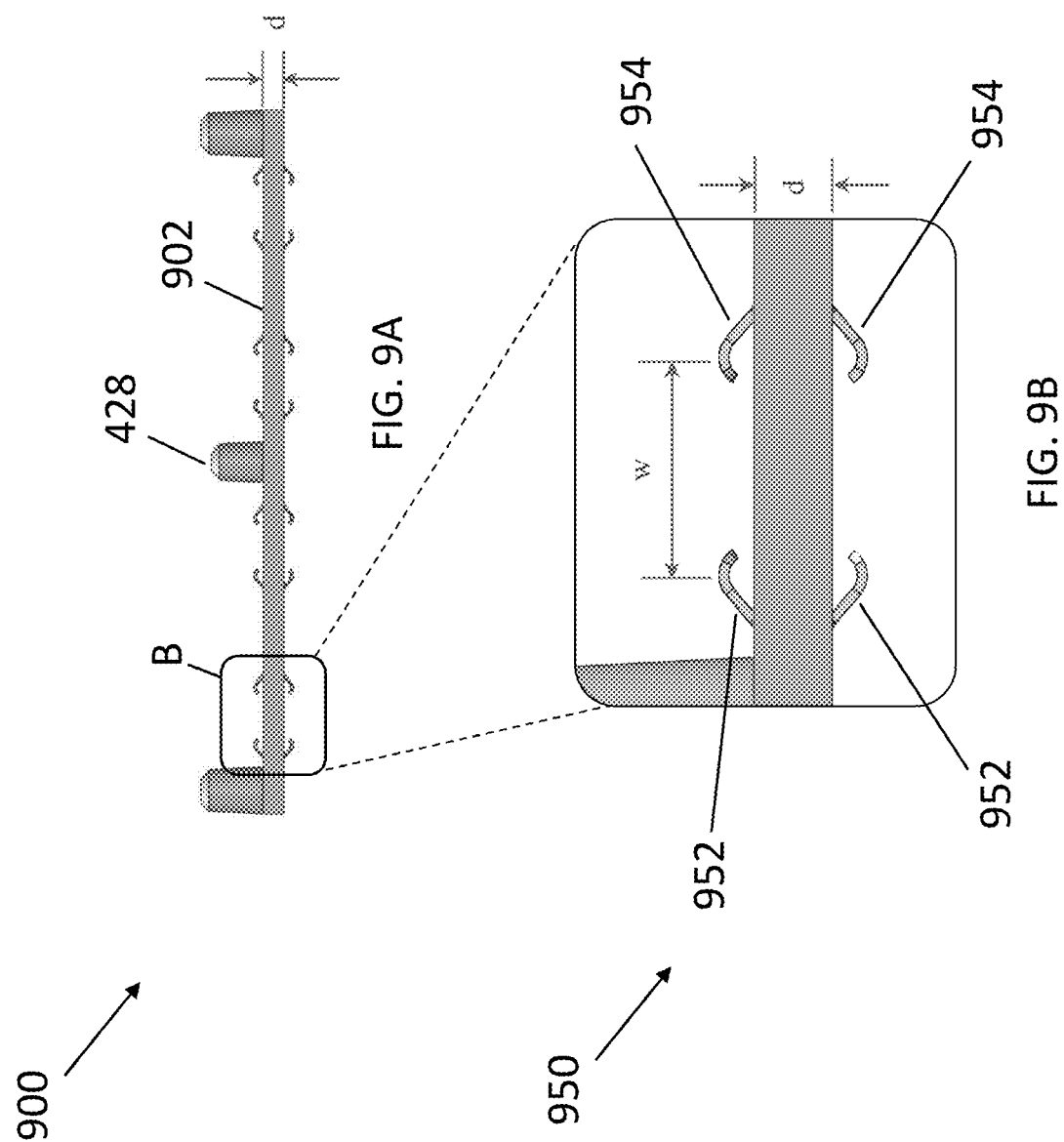

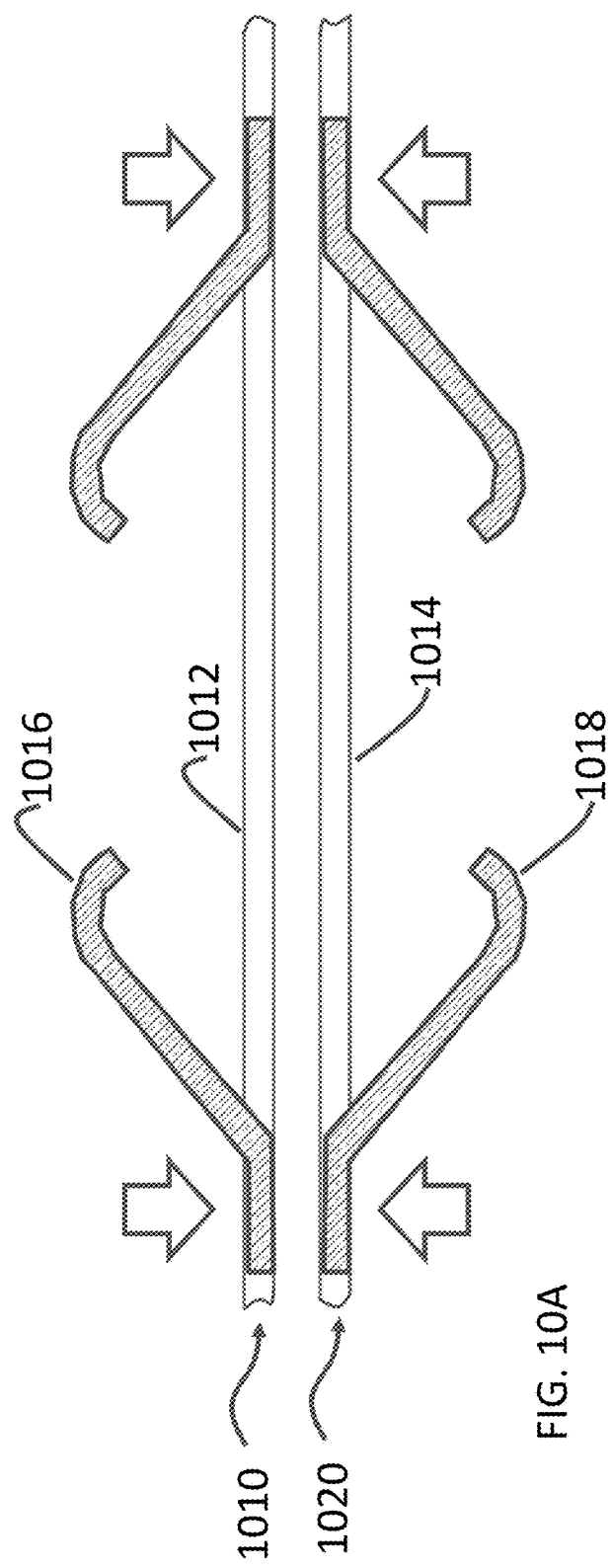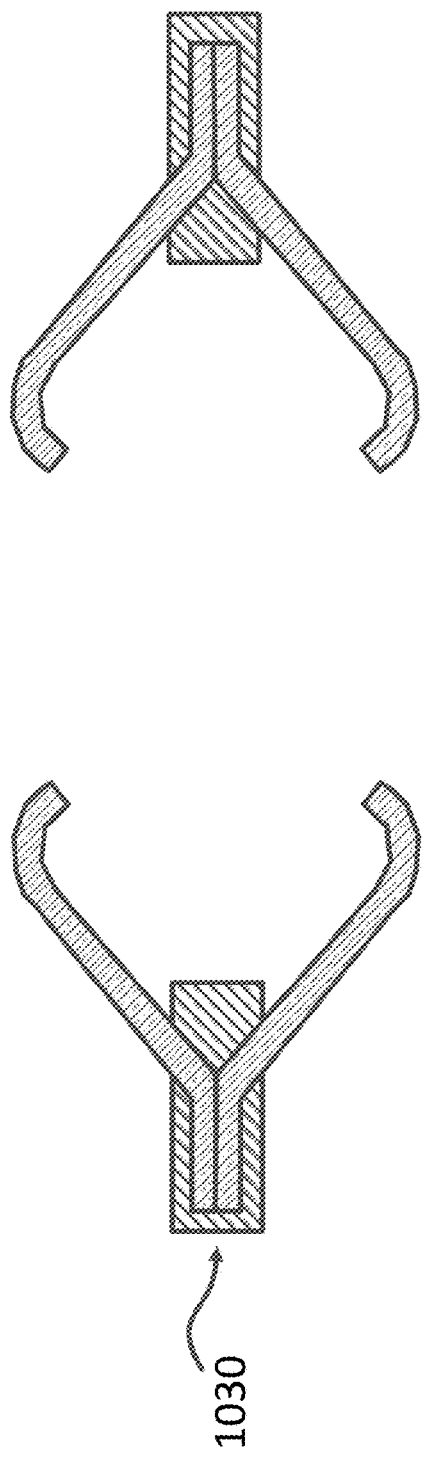
FIG. 10A
FIG. 10B

SMALL FORM FACTOR INTERPOSER

CROSS-REFERENCE TO RELATED APPLICATIONS

This application claims priority to and the benefit under 35 U.S.C. § 119(e) of U.S. Provisional Patent Application Ser. No. 62/850,381, filed on May 20, 2019, entitled "SMALL FORM FACTOR INTERPOSER," as well as claims priority to and the benefit under 35 U.S.C. § 119(e) of U.S. Provisional Patent Application Ser. No. 62/792,222, filed on Jan. 14, 2019, entitled "SMALL FORM FACTOR INTERPOSER." The entire contents of these applications are incorporated herein by reference in their entirety.

BACKGROUND

This patent application relates generally to interconnection systems, such as those including electrical connectors, used to interconnect electronic assemblies.

Electrical connectors are used in many electronic systems. It is generally easier and more cost effective to manufacture a system as separate electronic assemblies, such as printed circuit boards (PCBs), which may be joined together with electrical connectors. A known arrangement for joining several printed circuit boards is to have one printed circuit board serve as a backplane. Other printed circuit boards, called "daughterboards" or "daughtercards," may be connected through the backplane.

A backplane is a printed circuit board onto which many connectors may be mounted. Conducting traces in the backplane may be electrically connected to signal conductors in the connectors so that signals may be routed between the connectors. Daughtercards may also have connectors mounted thereon. The connectors mounted on a daughtercard may be plugged into the connectors mounted on the backplane. In this way, signals may be routed among the daughtercards through the backplane. The daughtercards may plug into the backplane at a right angle. The connectors used for these applications may therefore include a right angle bend and are often called "right angle connectors."

Connectors may also be used in other configurations for interconnecting printed circuit boards. Sometimes, one or more smaller printed circuit boards may be connected to another larger printed circuit board. In such a configuration, the larger printed circuit board may be called a "motherboard" and the printed circuit boards connected to it may be called daughterboards. Also, boards of the same size or similar sizes may sometimes be aligned in parallel. Connectors used in these applications are often called "stacking connectors" or "mezzanine connectors."

Connectors may also be used to enable signals to be routed to or from an electronic device. A connector, called an "I/O connector" may be mounted to a printed circuit board, usually at an edge of the printed circuit board. That connector may be configured to receive a plug at one end of a cable assembly, such that the cable is connected to the printed circuit board through the I/O connector. The other end of the cable assembly may be connected to another electronic device.

Cables have also been used to make connections within the same electronic device. The cables may be used to route signals from an I/O connector to a processor assembly that is located at the interior of printed circuit board, away from the edge at which the I/O connector is mounted. In other configurations, both ends of a cable may be connected to the same printed circuit board. The cables can be used to carry signals between components mounted to the printed circuit board near where each end of the cable connects to the printed circuit board.

Cables provide signal paths with high signal integrity, particularly for high frequency signals, such as those above 40 Gbps using an NRZ protocol. Cables are often terminated at their ends with electrical connectors that mate with corresponding connectors on the electronic devices, enabling quick interconnection of the electronic devices. Each cable has one or more signal conductors, which is surrounded by a dielectric material, which in turn is surrounded by a conductive layer. A protective jacket, often made of plastic, may surround these components. Additionally the jacket or other portions of the cable may include fibers or other structures for mechanical support.

One type of cable, referred to as a "twinax cable," is constructed to support transmission of a differential signal and has a balanced pair of signal wires, is embedded in a dielectric, and encircled by a conductive layer. The conductive layer is usually formed using foil, such as aluminized Mylar. The twinax cable can also have a drain wire. Unlike a signal wire, which is generally surrounded by a dielectric, the drain wire may be uncoated so that it contacts the conductive layer at multiple points over the length of the cable. At an end of the cable, where the cable is to be terminated to a connector or other terminating structure, the protective jacket, dielectric and the foil may be removed, leaving portions of the signal wires and the drain wire exposed at the end of the cable. These wires may be attached to a terminating structure, such as a connector. The signal wires may be attached to conductive elements serving as mating contacts in the connector structure. The drain wire may be attached to a ground conductor in the terminating structure. In this way, any ground return path may be continued from the cable to the terminating structure.

SUMMARY

In some aspects, embodiments of a midboard cable termination assembly are described.

In some embodiments, a midboard cable termination assembly comprises a lid, a frame having a first surface and a second surface, and a paddle card disposed within the frame. The paddle card may comprise at least one conductive hole and at least one pad electrically connected to the at least one conductive hole in the paddle card. The at least one pad may be configured to electrically connect to a termination end of a cable. The lid may be operably coupled to the frame such that the lid may be moved into a position in which the lid applies a force on the paddle card, the force urging the paddle card towards the second surface of the frame.

In some embodiments, a midboard cable termination assembly comprises a frame a lid and an interposer. The frame may have a first surface and a second surface and a first alignment feature. The interposer may comprise a plurality of compressive contacts and a second alignment feature, shaped to engage the first alignment feature. The frame and lid may be configured to provide a space to receive a paddle card to which a plurality of cables are terminated. The lid may be operably coupled to the frame such that the lid may be moved into a position in which the lid applies a force on a paddle card in the space such that the paddle card presses against the interposer.

In some embodiments, a midboard cable termination assembly may be operated according to a method comprising: inserting a paddle card into a cable termination assembly attached to an interior portion of a printed circuit board having pads on a surface thereof and moving a lid of the cable termination assembly from an open to a closed position. The paddle card may have a first surface and a second, opposing surface, with a plurality of cables terminated to the first surface and, on the second surface, a plurality of conductive pads, electrically coupled through the paddle card to the cable terminations. The cable termination assembly may comprise an interposer comprising a plurality of compressive contacts each having a first end and a second end, electrically coupled to the first end. Moving the lid of the cable termination assembly from an open to a closed position may generate a force on the paddle card, pressing the pads on the second surface of the paddle card against the first ends of the compressive contacts of the interposer, such that the second ends of the compressive contacts are pressed against the pads on the surface of the printed circuit board.

In some aspects, embodiments of a small form factor interposer are described.

In some embodiments, an interposer may comprise a first plurality of electrical contacts comprising a corresponding first plurality of bases, each of the first plurality of bases comprising opposing edges and opposing broadsides connecting the opposing edges and a second plurality of electrical contacts including a corresponding second plurality of bases, each of the second plurality of bases comprising opposing edges and opposing broadsides connecting the opposing edges. The first plurality of bases and the second plurality of bases may be electrically coupled with broadsides of the first plurality of bases parallel to and aligned with broadsides of the second plurality of bases such that the first plurality of electrical contacts points away from the second plurality of electrical contacts.

In some embodiments, a method for manufacturing an interposer may comprise providing a first sheet of conductive metal and a second sheet of conductive metal and forming a first plurality of electrical contacts in the first sheet, wherein the first plurality of electrical contacts are distributed in the first sheet in a particular configuration. The method may further comprise forming a second plurality of electrical contacts in the second sheet, wherein the second plurality of electrical contacts are distributed in the second sheet in the particular configuration and mechanically and electrically coupling the first plurality of electrical contacts and the second plurality of electrical contacts such that the first plurality of electrical contacts points away from the second plurality of electrical contacts.

In some embodiments, an electronic assembly may comprise a first printed circuit board comprising a first surface and a first plurality of conductive pads thereon and a second printed circuit board comprising a second surface and a second plurality of conductive pads thereon, wherein the second surface faces the first surface. The electronic assembly may further comprise an interposer between the first printed circuit board and the second printed circuit board. The interposer may comprise an insulative member comprising a first surface facing the first surface of the first printed circuit board and a second surface facing the second surface of the second printed circuit board. The interposer may comprise a first plurality of contacts. Each contact of the first plurality of contacts may comprise a base portion within the insulative member and a beam portion extending from the insulative member beyond the first surface of the insulative member. Each contact of the first plurality of contacts may contact a pad of the first plurality of conductive pads. The interposer may comprise a second plurality of contacts. Each contact of the second plurality of contacts may comprise a base portion within the insulative member and a beam portion extending from the insulative member beyond the second surface of the insulative member and may contact a pad of the second plurality of conductive pads. The beam portions of the first plurality of contacts may be aligned, in a direction perpendicular to the first surface of the first printed circuit board, with the beam portions of the second plurality of contacts.

In some embodiments, an interposer may comprise a first plurality of electrical contacts comprising a corresponding first plurality of bases, each of the first plurality of bases comprising opposing edges and opposing broadsides connecting the opposing edges and a second plurality of electrical contacts including a corresponding second plurality of bases, each of the second plurality of bases comprising opposing edges and opposing broadsides connecting the opposing edges. The first plurality of bases and the second plurality of bases may be electrically coupled with broadsides of the first plurality of bases parallel to and offset from broadsides of the second plurality of bases such that the first plurality of electrical contacts points away from the second plurality of electrical contacts.

The foregoing features may be used separately or in any suitable combination. The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 8A is a plan view of an illustrative interposer, in accordance with some embodiments;

FIG. 8B is an enlarged view of a portion of the illustrative interposer of FIG. 8A within box A, in accordance with some embodiments;

FIG. 9A is a side view of an illustrative interposer, in accordance with some embodiments;

FIG. 9B is an enlarged view of the illustrative interposer of FIG. 9A within box B, in accordance with some embodiments;

FIG. 10A is a cross section of portions of two sheets of metal in a stage of manufacture of an interposer according to some embodiments;

FIG. 10B is a cross section of the portion of the interposer of FIG. 10A in a subsequent stage of manufacture;

DESCRIPTION OF PREFERRED EMBODIMENTS

The inventors have recognized and appreciated techniques that enable electrical connections with high signal integrity to be made to locations at the interior of a printed circuit board. The inventors have also recognized and appreciated techniques for making a high density interposer. These techniques may be used separately or together, in any suitable combination.

High integrity connections may be made to the interior of a printed circuit board through a midboard cable termination assembly. Such a termination assembly may have a frame that positions a paddle card to which multiple cables may be terminated. The frame may also position an interposer such that, when the paddle card is positioned by the frame, it is also aligned with the interposer. The midboard cable termination assembly may have a lid, which is movable between an open and closed position. With the lid in the open position, the paddle card may be easily inserted into the frame. With the lid rotated or otherwise moved into the closed position, the lid applies force that urges the paddle card towards a lower surface of the frame such that the paddle card presses against the interposer. Resulting compression of the interposer makes electrical contact between pads on a lower surface of the paddle card and pads on an upper surface of a printed circuit board to which the midboard cable termination assembly is mounted.

The interposer may be thin and may have a high density of contacts making connection between the paddle card and the printed circuit board. In some embodiments, the interposer may have a thickness of less than 6 mm or less than 5 mm or less than 4 mm. In some embodiments, the interposer may have a thickness between 1 mm and 5 mm or between 2.5 mm and 4.5 mm, or, in some embodiments approximately 4 mm. The contacts may be spaced in rows with a contact pitch of less than 1 mm, such as between 0.4 mm and 0.7 mm. The rows may be spaced with an average spacing of less than 1.8 mm, in some embodiments, yielding a contact density on the order of 1 contact per $mm^2$, such as between 1 and 3 contacts per $mm^2$. Such an interposer may be suited for making a midboard cable termination assembly that has a height above a printed circuit to which the termination assembly is mounted of less than 6 mm. Such an interposer, however, may be used in any application in which a compact and high density interposer is beneficial.

Figure 6:
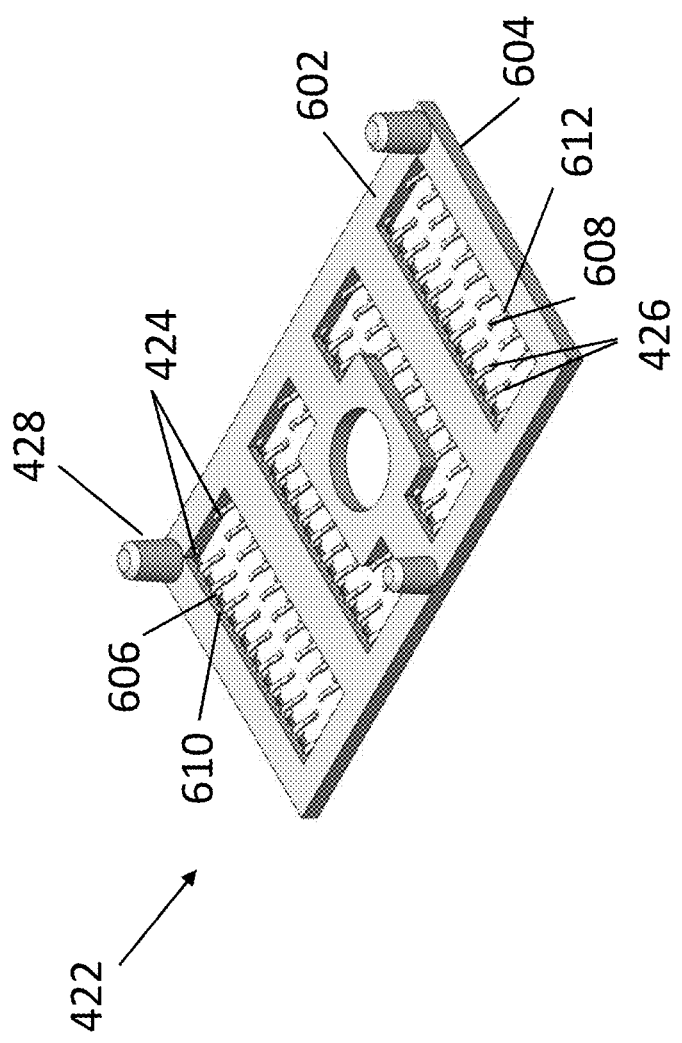
FIG. 6 is an isometric view of an illustrative interposer, in accordance with some embodiments.

A short and high density interposer may be achieved with contacts formed as two beams, joined at their bases. For example, FIGS. 9A and 9B show an illustrative interposer with contacts formed as two beams and joined at their bases. The bases may have broadsides and may be joined broadside to broadside. For example, FIGS. 10A and 10B shown an illustrative interposer where the bases have broadsides and are joined broadside to broadside. In some embodiments, the bases as joined may form a planar structure parallel to the surfaces to be electrically connected by the interposer. For example, FIG. 6 shows an illustrative interposer where the bases as joined form a planar structure. The bases of the beams, for example, may be joined using laser welding or other suitable attachment technique. The joined bases may be fully or partially encapsulated in plastic or other dielectric materials to hold the contacts with a desired spacing.

Figure 1:
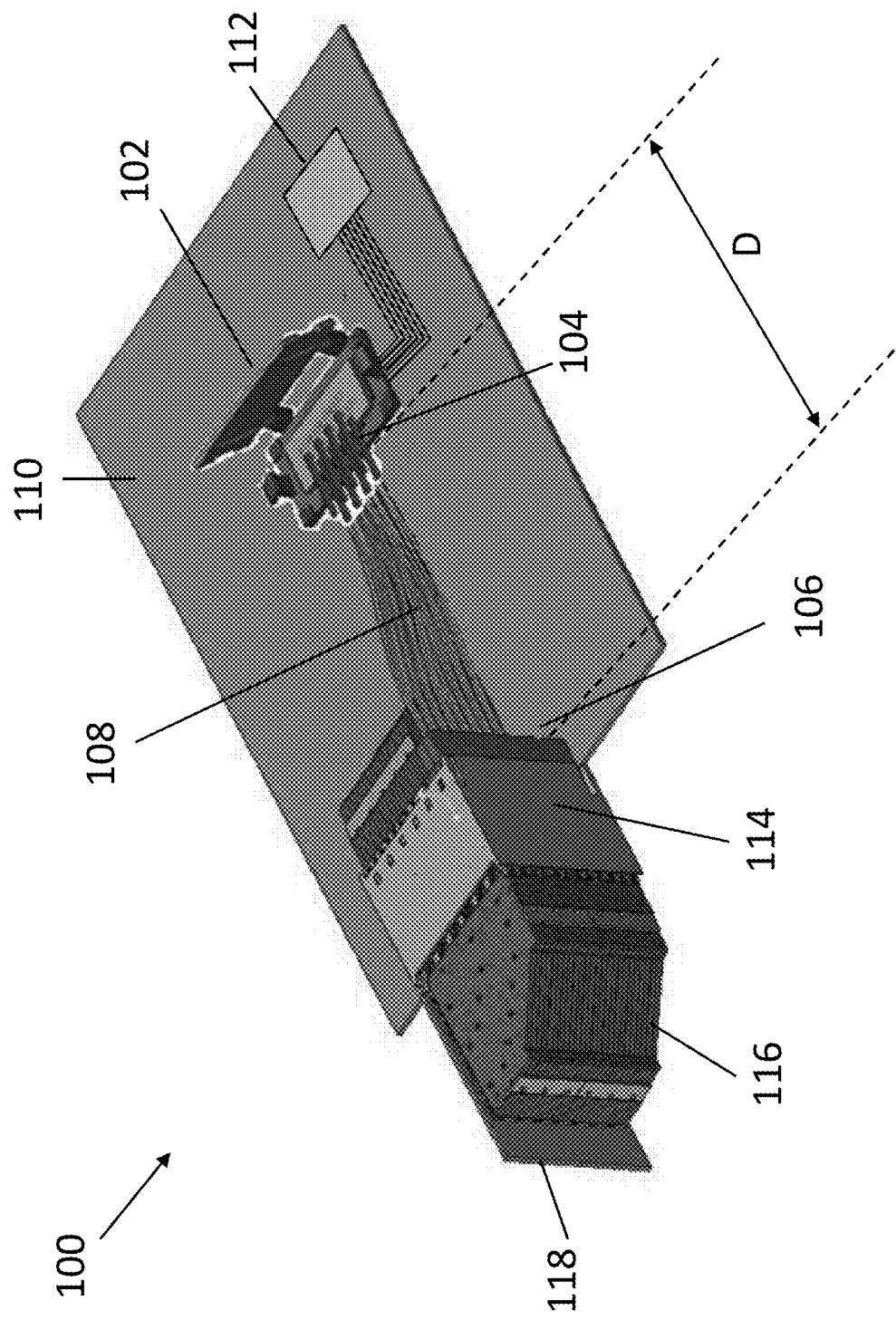
FIG. 1 is an isometric view of an illustrative midboard cable termination assembly disposed on a printed circuit board, in accordance with some embodiments.

FIG. 1 shows an isometric view 100 of an illustrative midboard cable termination assembly disposed on a printed circuit board, in accordance with some embodiments. In the illustrated example, the midboard cable termination assembly is used to provide a low loss path for routing electrical signals between one or more components, such as component 112, mounted to printed circuit board 110 and a location off the printed circuit board. Component 112, for example, may be a processor or other integrated circuit chip. However, any suitable component or components on printed circuit board 110 may receive or generate the signals that pass through the midboard cable termination assembly.

In the illustrated example, the midboard cable termination assembly couples signals between component 112 and printed circuit board 118. Printed circuit board 118 is shown to be orthogonal to circuit board 110. Such a configuration may occur in a telecommunications switch or other types of electronic equipment. However, a midboard cable termination assembly may be used to couple signals between a location in the interior of a printed circuit board and one or more other locations.

FIG. 1 shows a portion of an electronic system including midboard cable termination assembly 102, cables 108, component 112, right angle connector 114, connector 116, and printed circuit boards (PCBs) 110, 118. Midboard cable termination assembly 102 may be mounted on PCB 110 near component 112, which is also mounted on PCB 110. Midboard cable termination assembly 102 may be electrically connected to component 112 via traces in PCB 110. Other suitable connections techniques, however, may be used instead of or in addition to traces in a PCB. In other embodiments, for example, midboard cable termination assembly 102 may be mounted to a component package containing a lead frame with multiple leads, such that signals may be coupled between midboard cable termination assembly 102 and the component through the leads.

Cables 108 may electrically connect midboard cable termination assembly 102 to a location remote from component 112 or otherwise remote from the location at which midboard cable termination assembly 102 is attached to PCB 110. In the illustrated embodiment, a second end of cable 108 is connected to right angle connector 114. Connector 114 is shown as an orthogonal connector that can make separable electrical connections to connector 116 mounted on a surface of printed circuit board 118 orthogonal to printed circuit board 110. Connector 114, however, may have any suitable function and configuration.

In the embodiment illustrated, connector 114 includes one type of connector units mounted to PCB 110 and another type of connector units terminating cables 108. Such a configuration enables some signals routed through connector 114 to connector 116 to be connected to traces in PCB 110 and other signals to pass through cables 108. In some embodiments, higher frequency signals, such as signals above 10 GHz or above 25 GHz in some embodiments, may be connected through cables 108.

In the illustrated example, the midboard cable termination assembly 102 is electrically connected to connector 114. However, the present disclosure is not limited in this regard. The midboard cable termination assembly 102 may be electrically connected to any suitable type of connector or component capable of accommodating and/or mating with the second ends 106 of cables 108.

Cables 108 may have first ends 104 attached to midboard cable termination assembly 102 and second ends 106 attached to connector 114. Cables 108 may have a length that enables midboard cable termination assembly 102 to be spaced from second ends 106 at connector 114 by a distance D.

In some embodiments, the distance D may be longer than the distance over which signals at the frequencies passed through cables 108 could propagate along traces within PCB 110 with acceptable losses. Any suitable value, however, may be selected for distance D. In some embodiments, D may be at least six inches, in the range of one to 20 inches, or any value within the range, such as between six and 20 inches. However, the upper limit of the range may depend on the size of PCB 110, and the distance from midboard cable termination assembly 102 that components, such as component 112, are mounted to PCB 110. For example, component 112 may be a microchip or another suitable high-speed component that receives or generates signals that pass through cables 108.

Midboard cable termination assembly 102 may be mounted near components, such as component 112, that receive or generate signals that pass through cables 108. As a specific example, midboard cable termination assembly 102 may be mounted within six inches of component 112, and in some embodiments, within four inches of component 112 or within two inches of component 112. Midboard cable termination assembly 102 may be mounted at any suitable location at the midboard, which may be regarded as the interior regions of PCB 110, set back equal distances from the edges of PCB 110 so as to occupy less than 80% of the area of PCB 110.

Midboard cable termination assembly 102 may be configured for mounting on PCB 110 in a manner that allows for ease of routing of signals coupled through connector 114. For example, the footprint associated with mounting midboard cable termination assembly 102 may be spaced from the edge of PCB 110 such that traces may be routed out of that portion of the footprint in all directions, such as towards component 112. In contrast, signals coupled through connector 114 into PCB 110 will be routed out of a footprint of connector 114 towards the midboard.

Further, connector 114 is attached with eight cables aligned in a column at second ends 106. The column of cables are arranged in a 2×4 array at first ends 104 attached to midboard cable termination assembly 102. Such a configuration, or another suitable configuration selected for midboard cable termination assembly 102, may result in relatively short breakout regions that maintain signal integrity in connecting to an adjacent component in comparison to routing patterns that might be required were those same signals routed out of a larger footprint.

The inventors have recognized and appreciated that signal traces in printed circuit boards may not provide the signal density and/or signal integrity required for transmitting high speed signals, such as those of 25 GHz or higher, between high-speed components mounted in the midboard and connectors or other components at the periphery of the PCB. Instead, signal traces may be used to electrically connect a midboard cable termination assembly to a high-speed component at short distance, and in turn, the midboard cable termination assembly may be configured to receive termination ends of one or more cables carrying the signal over a large distance. Using such a configuration may allow for greater signal density and integrity to and from a high-speed component on the printed circuit board.

Figure 2:
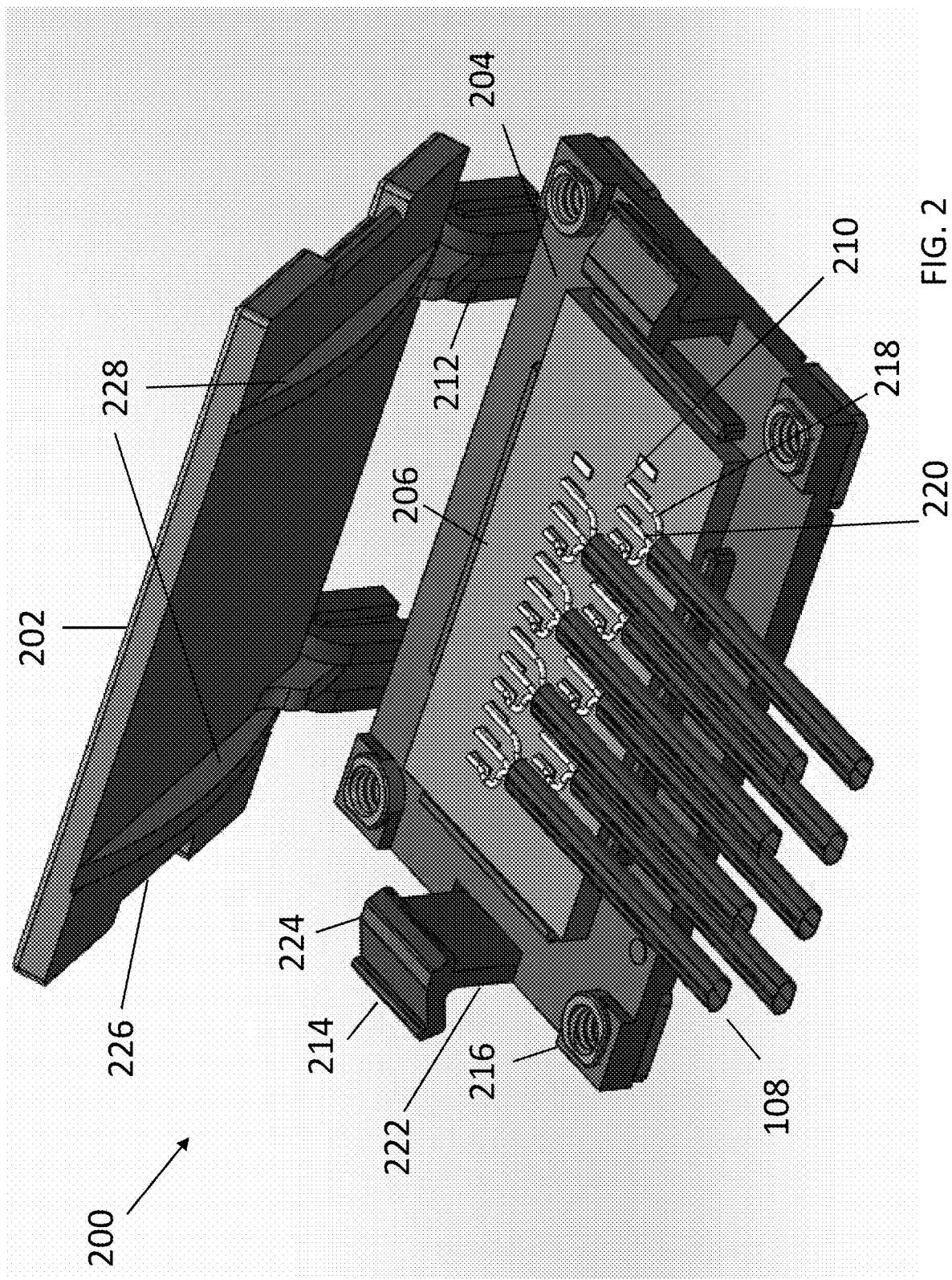
FIG. 2 is an isometric view of an illustrative midboard cable termination assembly in an open configuration, in accordance with some embodiments.

FIG. 2 shows isometric view 200 of an illustrative midboard cable termination assembly in an open configuration, in accordance with some embodiments. In the illustrated example, FIG. 2 shows midboard cable termination assembly 102 having lid 202, frame 204, and paddle card 206 disposed within frame 204.

Frame 204 may be held in place using hold downs 216. Frame 204 may be attached in a particular location of PCB 110 or in any other suitable location through the use of hold downs. Hold downs 216 may be threaded holes that receive screws passing through PCB 110. However, other types of hold downs may be used, such as posts that make an interference fit with holes in PCB 110 or compliant pins. As another example, hold downs 216 may include pads on a lower surface of frame 204 that may be soldered to pads on a PCB.

Lid 202 may be operable to move between an open and a closed position, such as, for example, by being connected to frame 204 via hinge 212. Lid 202 may be coupled to the rest of midboard cable termination assembly such that lid 202 applies a force on paddle card 206 when closed. That force may urge paddle card 206 towards a surface of frame 204 facing a printed circuit board to which midboard cable termination assembly is mounted. Lid 202 may be operable to assert such a force due to movement of hinge 212. However, the present disclosure is not limited in this regard. For example, lid 202 may be separate from frame 204 and secured to frame 204 with an attachment mechanism. Lid 202 may include projections 228 that align with the edges of paddle card 206. Projections 228 may allow force to be applied on paddle card 206 from lid 202 without crushing any cables or cable terminations disposed on paddle card 206.

Even if not a separate component, lid 202 may be held in the closed position with a releasable attachment mechanism. In the embodiment of FIG. 2, lid 202 may be held in a closed position with respect to frame 204 via one or more latches, which may be spring-biased. Lid 202 may apply a force on paddle card 206 when latched to frame 204. In the embodiment of FIG. 2, lid 202 may be held in the closed position by latches 214. Latches 214 may hold lid 202 in a position in which it exerts a force on paddle card 206 and may prevent lid 202 from opening due to forces generated by shock or vibration.

Figure 3:
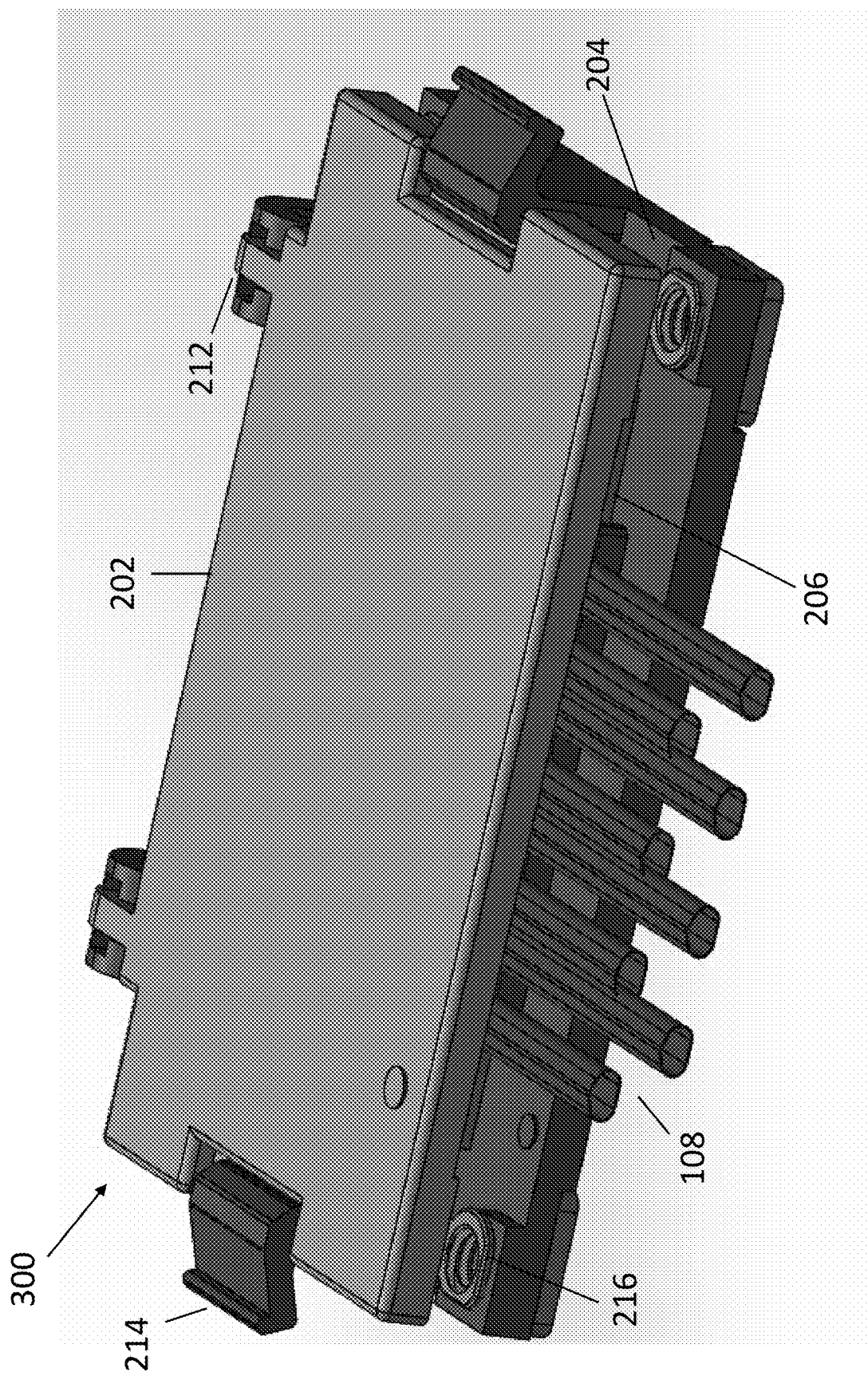
FIG. 3 is an isometric view of an illustrative midboard cable termination assembly in a closed configuration, in accordance with some embodiments.

In the embodiment illustrated, latches 214 are integrally molded as part of frame 204. Each of latches 214 has neck 222 that is sufficiently long and flexible that the latch will deflect away from the center of midboard cable termination assembly when a force perpendicular to an upper surface of frame 204 is applied to it. However, the neck will be sufficiently rigid that latch 214 will spring back to the position indicated when the force is removed. Latch 214 further includes head 224 with a tapered surface that is positioned to interfere with surface 226 of lid 202 when lid 202 is moved from an open to a closed position. Surface 226 of lid 202 and/or head 224 of latch 214 may be tapered, acting as a camming surface such that downward force on lid 202 is translated into a force that pushes head away from the center of midboard cable termination assembly. When surface 226 clears the head of latch 214, that force is removed and latch 214 will spring back, engaging an upper surface of lid 202, as shown in FIG. 3. However, the present disclosure is not limited in this regard. For example, a clamping member may be provided over midboard cable termination assembly 102 to retain the position of lid 202.

Paddle card 206 may be constructed using techniques known for use in paddle cards of plug connectors, including multilayer PCB manufacturing techniques. Paddle card 206 may include conductive interconnects between an upper surface and a lower surface. Those conductive interconnects may be formed with conductive holes and, in some embodiments, conductive traces. Accordingly, paddle card 206 may have at least one conductive hole (not shown).

Pads 210 may be disposed on paddle card 206 such that pads 210 are electrically connected to the conductive holes in paddle card 206. Pads 210 may be configured to terminate cables 108. Lid 202 may be contoured to accommodate ends of cables 108 terminated to paddle card 206. However, the present disclosure is not limited in this regard. For example, lid 202 may be composed of material or be may be lined on the inner surface with material that is compliant to accommodate the termination ends of cables 108.

Each cable 108 may include one or more conductors. In some embodiments, each cable may have two signal wires and a shield surrounding the signal wires. In the illustrated embodiment, each cable 108 further includes a drain wire connected to the shield. Accordingly, cable 108 is illustrated as having a pair of signal wires 218, 220 and a drain wire. In some embodiments, cables 108 may include a twinax cable including signal wires 218, 220, each covered by a dielectric coating. The twinax cable may further include a third, uncovered wire, the drain wire. Signal wires 218, 220 and the drain wire may be surrounded by a conductive layer configured to serve as an electric shield. The drain wire may electrically contact the conductive layer at multiple locations along the cable (not shown), thus maintaining a ground reference with the conductive layer. As illustrated in FIG. 2, the enclosing jacket and the conductive layer have been removed from the end of the cable to permit termination.

Paddle card 206 may include pads 210 in a spaced arrangement suitable for receiving multiple cables 108. Paddle card 206 may include a grounding structure. When cables 108 are terminated at pads 210, signal wires 218, 220 may form electrical contacts with the pads 210. The shield and/or the drain may be attached to the grounding structure. For example, the grounding structure may contact the various drain wires, thus keeping the cables grounded. In the illustrated embodiment, the grounding structure is connected to additional pads on the upper surface of paddle card 206 and the drain wire is attached to such a pad.

However, other techniques to ground cables 108 may be used. Cable termination assemblies using a conductive, compliant member as part of a termination, as described below, enable use of cables without drain wires. Such cables may be lighter and more flexible than cables with drain wires. Moreover, the such cable termination assemblies may simplify terminating cables to paddle card 206, as a drain wire would not have to be separated from the cable or attached to paddle card 206.

In some embodiments, a conductive, compliant material may be positioned to make an electrical connection between a conductive layer of cable 108 and the grounding structure of paddle card 206. To make such a connection, the insulating cover on the conductive layer may be removed at the end of the cable, exposing the conductive layer of cable 108.

The conductive, compliant member may be mounted between the grounding portion of paddle card 206 and the conductive layer of cable 108. The conductive, compliant material, for example, may partially or fully encircle cable 108 and also contact the grounding portion of paddle card 206. Force may be generated by closing lid 202, or in any other suitable way. The force may create a reliable electrical connection between the conductive layer of the cable 108 and the grounding portion of paddle card 206 via the conductive, compliant member.

When mounted between the conductive layer of cable 108 and the grounding portion of paddle card 206, the conductive, compliant member may form a conducting path between those structures of less than 100 Ohms in some embodiments, less than 75 Ohms in some embodiments, less than 50 Ohms in some embodiments, less than 25 Ohms in some embodiments, less than 10 Ohms in some embodiments, less than 5 Ohms in some embodiments or less than 1 Ohm in some embodiments. When mounted between the conductive layer of the cable 108 and the grounding portion of paddle card 206, the conductive, compliant member may form a conducting path between those structures of at least 0.5 Ohms in some embodiments, at least 1 Ohm in some embodiments, at least 5 Ohms in some embodiments, at least 10 Ohms in some embodiments, at least 25 Ohms in some embodiments or at least 50 Ohms in some embodiments. In such embodiments, the connection may be suitable for grounding.

In some embodiments, the conductive, compliant member may be a conductive elastomer. A conductive elastomer may be formed by adding conductive filler to an elastomer. In some embodiments, the elastomer may be configured to elongate by a percentage that is at least 90%. In some embodiments, the elastomer may be configured to elongate, without breaking, by a percentage that is less than 1120%. The elastomer, for example, may be a silicone rubber. The filler may be particles in any suitable form, including plates, spheres, fibers, or of any other suitable geometry. As a specific example, the conductive, compliant member may be made of silver-plated glass micro spheres suspended in high consistency rubber (HCR) silicone.

The material may be compliant as a result of a reduction in volume of the material under pressure. Material with this property may be created, for example, by creating open-celled foam within the material. Alternatively or additionally, the material may be made compliant as a result of flowing under pressure.

Figure 11:
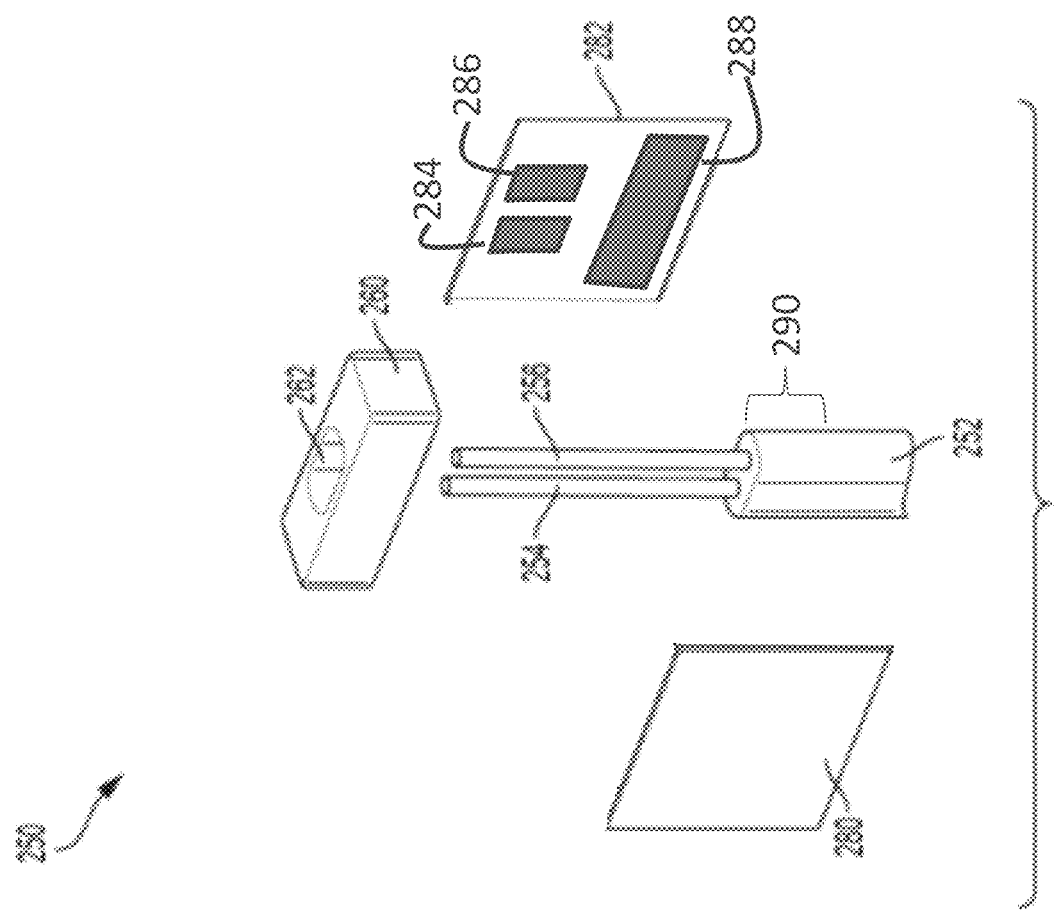
FIG. 11 is an exploded isometric view, partially cut away, of components making electrical connection between a shield in a drainless cable and a paddle card, in accordance with some embodiments.

According to one aspect of the present application, the flexibility of the cables and the cost associated with the termination of the cables may be reduced by using electrical terminations comprising a conductive, compliant material in conjunction with a drainless cable. FIG. 11 is an exploded view of a portion of a midboard cable termination assembly, in accordance with some embodiments. Cable termination 250 may comprise the end of a cable 252 and a conductive, compliant member 260. Cable 252 may be terminated to a paddle card 282, which may be used in a midboard cable termination assembly with a frame, lid and interposer as described elsewhere herein.

The opposite end of cable 252 may be configured to mate with another electronic device, such as a connector 116 described above. Cable 252 may have characteristics selected for the types of signals to pass between the connected devices. For example, cable 252 may comprise a pair of signal conductors 254 and 256, which may be configured to carry a differential signal in some embodiments. Cable 252 may be configured to support signals having any suitable electric bandwidth, such as more than 20 GHz, more than 30 GHz or more than 40 GHz.

Paddle card 282 has on one surface pads 284, 286 and 288. In the embodiment illustrated, pads 284 and 286 are signal pads. Those pads may be connected to signal pads on the opposing surface of paddle card 282 where they can be coupled, for example via an interposer as described herein, to signal traces within a printed circuit board, such as PCB 110, to which a midboard cable termination assembly may be mounted. Signal conductors 254 and 256 may be attached, such as by soldering, to pads 284 and 286, respectively.

Pad 288 is here illustrated as a ground pad. Pad 288 may be connected to a ground pad on the opposing surface of paddle card 282 where it can be coupled, for example via an interposer as described herein, to ground layers within a printed circuit board, such as PCB 110, to which a midboard cable termination assembly may be mounted.

In the embodiment illustrated, a shield layer of cable 252 is exposed in end region 290, such as by stripping a portion of a polymer jacket (not numbered) from cable 252. Here the connection between the exposed shield and the ground structure of the midboard cable termination assembly may be made through conductive, compliant member 260.

In the embodiment illustrated, conductive, compliant member 260 fully surrounds cable 252. As shown, conductive, compliant member 260 has a hole 262 through which end region 290 is inserted. Conductive, compliant member 260 is then positioned to surround end region 290 where it can make contact with the exposed shield layer. Conductive, compliant member 260 is also aligned with pad 288.

Though not shown in FIG. 11, paddle card 282 may be held in a frame or otherwise supported in a midboard cable termination assembly. When lid 280 is moved into a closed position, it will exert a force on compliant member 260. That force improves the electrical contact between conductive, compliant member 260 and both the exposed shield layer of cable 252 and pad 288. In this way, a low resistance contact, such as 10 Ohms or less, and in some embodiments 5 Ohms or less, between the cable shield and the grounding structure of the midboard cable termination assembly is created. That termination may be created without the use of a drain wire.

It should be appreciated that FIG. 11 illustrates a portion of a midboard cable termination assembly. The illustrated structure may be repeated for each of multiple cables terminated to a midboard cable termination assembly, such as the eight cables illustrated in FIG. 2. Moreover, when multiple cables are terminated, variations in components may be possible. For example, the same conductive, compliant member may fully or partially surround multiple cables, such as by producing one member with multiple holes. Alternatively, the compliant conductive member may be attached to another structure within the midboard cable termination assembly rather than fitted around a cable. For example, a filled elastomeric material might be deposited on pad 288 and/or cover 280. Accordingly, it should be appreciated that FIG. 11 illustrates just one exemplary approach for making an electrical connection between a cable shield and a ground structure with a midboard cable termination assembly.

FIG. 3 shows isometric view 300 of an illustrative midboard cable termination assembly in a closed configuration, in accordance with some embodiments. In the illustrated example, FIG. 3 shows midboard cable termination assembly 102 in a state in which lid 202 is applying a force on paddle card 206. In an embodiment, such as is shown in FIG. 11, in which there is one or more conductive, compliant member within the midboard cable termination assembly, closing the lid as illustrated in FIG. 3 may alternatively or additionally exert force on those members. Frame 204 may have a first surface facing towards lid 202 and a second surface facing away from lid 202, towards PCB 110 in the example of FIG. 1. The applied force may be sufficient to urge paddle card 206, positioned within frame 204, towards the second surface of frame 204. Midboard cable termination assembly 102 may be configured such that urging paddle card 206 in this direction, which is toward a PCB to which the assembly is mounted, may create an electrical connection between one or more signal traces on the printed circuit board and conductive pads on a lower surface of paddle card 206. Such an electrical connection may be created by springs or other type of compliant electrical contacts of an interposer (e.g., described with respect to FIGS. 4-5), or another suitable electrical contact.

The inventors have recognized and appreciated that the housing of midboard cable termination assembly 102, including lid 202 and frame 204, may be rigid and add to the profile or thickness of the assembly. The thickness of the assembly can be a detriment in miniaturized electronic systems such as mobile consumer products or in high speed electronic assemblies where it is undesirable to have components mounted in the midboard region that can obstruct the flow of cooling air over the assembly or in a low profile enclosure, such as an enclosure of 1U or less. This thickness is further exacerbated when using surface mount soldering, conductive adhesive, or another mounting solution that adds to the overall height of a top surface of the assembly. Mounting the assembly using a small form factor interposer, as described below, may reduce the profile or thickness of the mounted assembly.

Figure 4:
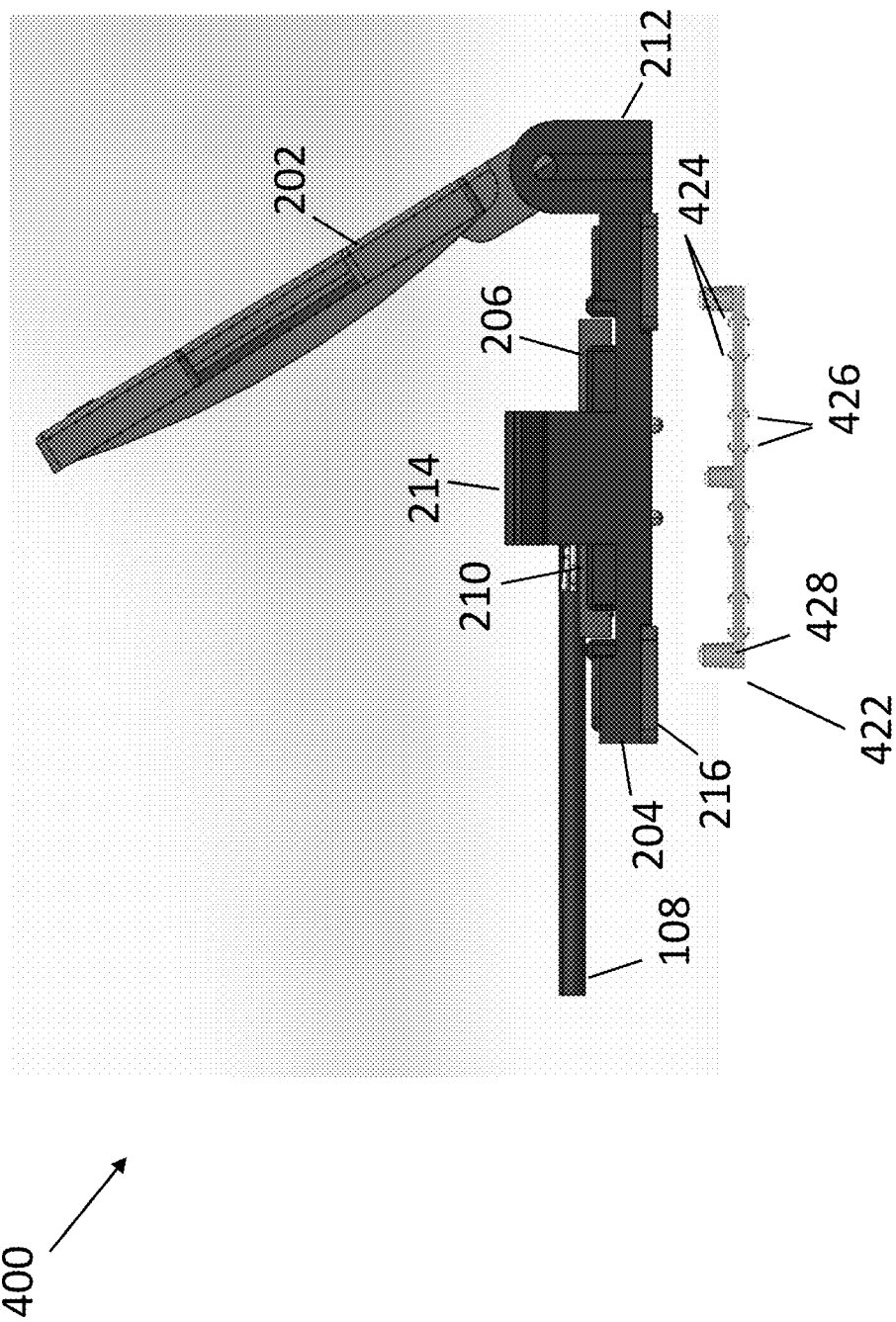
FIG. 4 is a side view, partially exploded, of an illustrative midboard cable termination assembly in an open configuration, in accordance with some embodiments.

FIG. 4 shows side view 400 of an illustrative midboard cable termination assembly, partially exploded, in an open configuration, in accordance with some embodiments. In the illustrated example, FIG. 4 shows frame 204 separated from small form factor interposer 422. Interposer 422 may include spring or compliant electrical contacts extending outward from the interposer. Electrical contacts 424 may extend toward midboard cable termination assembly 102, and may be positioned to make contact with conductive pads on the lower surface of paddle card 206. Electrical contacts 426 may extend away from midboard cable termination assembly 102, and e.g., toward pads on a surface of printed circuit board to which the assembly is mounted such that electrical connections may be made to signal traces within the printed circuit board. Pairs of contacts extending in opposite directions from interposer 422 may be electrically connected within interposer 422 such that connections may be made between paddle card 206 and the printed circuit board.

Interposer 422 may include pillars 428 for orienting interposer 422 with respect to frame 204. Pillars 428 may fit with one or more openings in frame 204 for alignment of interposer 422 and frame 204. Additionally or alternatively, pillars 428 may hold interposer 422 within frame 204 such that once frame 204 is attached to a printed circuit board, such as through the hold downs 216, interposer 422 may be captured between frame 204 and the printed circuit board. As interposer 422 is fixed with respect to frame 204, paddle card 206 aligned within frame 204 will also be aligned with interposer 422 (and electrical contacts 424). Further details regarding interposer 422 are described with respect to FIGS. 6-9 below.

Figure 5:
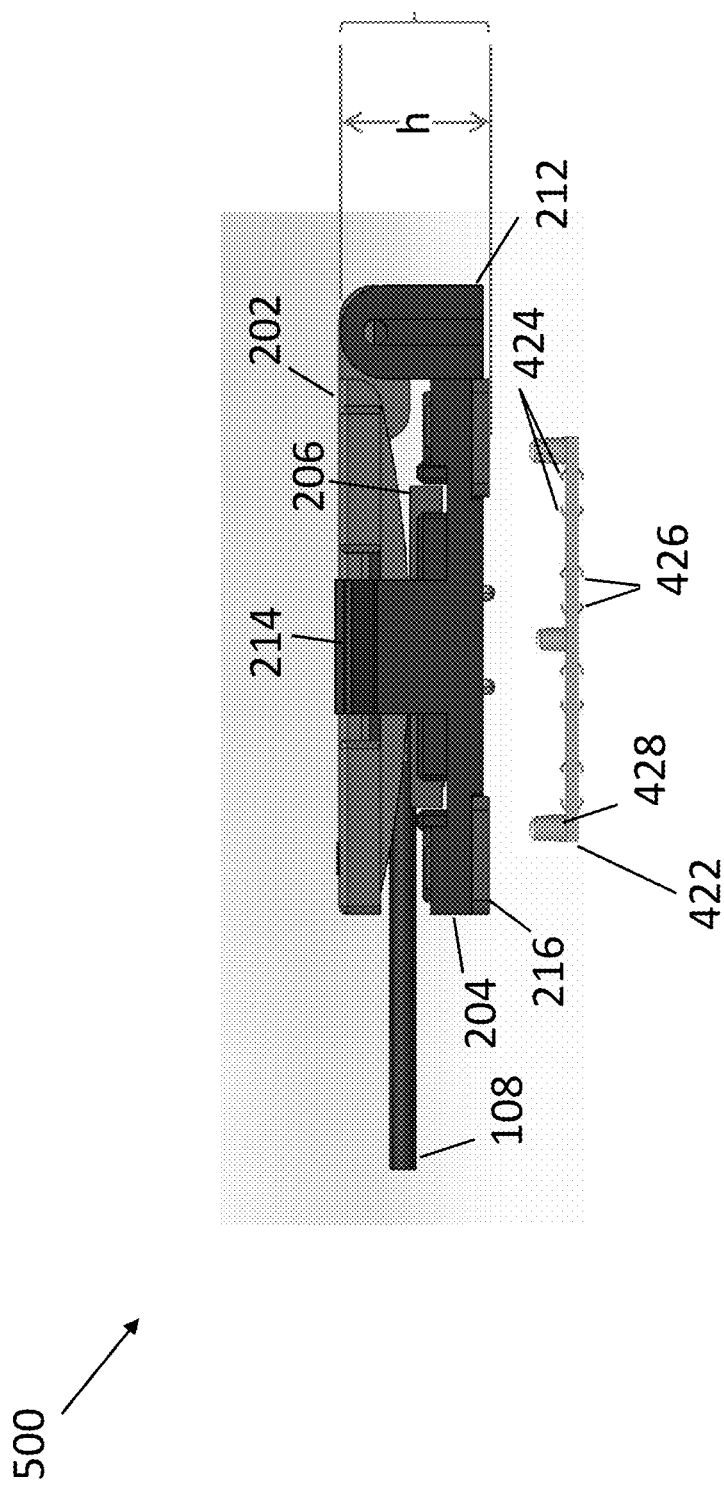
FIG. 5 is a side view, partially exploded, of an illustrative midboard cable termination assembly in a closed configuration, in accordance with some embodiments.

FIG. 5 shows side view 500, partially exploded, of an illustrative midboard cable termination assembly in a closed configuration, in accordance with some embodiments. Interposer 422 is shown exploded from frame 204. In the illustrated example, FIG. 5 shows the midboard cable termination assembly 102 having lid 202 apply a force towards the frame 204. The frame 204 has a first surface facing towards the lid 202 and a second surface facing away from the lid 202. Force exerted by lid 202 may urge paddle card 206, disposed within frame 204, towards the second surface of frame 204. The applied force may be sufficient to urge the paddle card 206 towards the second surface such that the paddle card 206 may come in electrical contact with spring or compressive electrical contacts 424 of interposer 422. That same force will press interposer 422 towards a surface of a printed circuit board to which midboard cable termination assembly 102 is mounted. As a results, contacts 426 are pressed into contact with pads on the surface of the printed circuit board. In such cases, interposer 422 may act as a dual compression connector, making connection between two pads on surfaces of two components without the use of solder. Within interposer 422, contacts 424 are connected to contacts 426. As a result, the electrical connections are made from cables 108, through paddle card 206 and then through interposer 422 to a printed circuit board.

In some embodiments, the combined thickness or height, h, of the mounted interposer 422 may be low enough such that the resulting thickness is not a detriment for suitable applications, such as in miniaturized electronic systems, mobile consumer products, or another suitable applications. The height, h, from a top surface of midboard cable termination assembly 102 to a surface of the substrate on which interposer 422 is mounted, such as a printed circuit board, may be low, such as 5.55 mm in some embodiments, less than 10 mm in some embodiments, less than 5 mm in some embodiments, less than 2 mm in some embodiments, or within the range of 3.5 to 6 mm in some embodiments.

The inventors have recognized and appreciated techniques for manufacturing such low profile interposers that enable a high density of interconnections. In some interposers, both upwardly facing contacts 424 and downward facing contacts 426 may be formed from a single sheet of conductive metal. An upwardly facing contact and a downwardly facing contact, and a metal web joining them, may be stamped from the same sheet. However, the density of connections through the interposer is limited by the area of the material in the sheet that must be used to form both an upwardly facing contact and a downwardly facing contact and any material joining the two. The electrical contacts may at most be formed adjacent to one another in the single sheet such that their proximal ends are in electrical contact, but the distal ends of the electrical contacts cannot be aligned in a direction orthogonal to the surface of the sheet. Forming the interposer from two sheets of conductive metal, as described below, may allow for a small form factor due to high density of spring or compressive electrical contacts. Upwardly facing electrical contacts may be formed in the first sheet and downwardly facing contacts may be formed in the second sheet. The contacts may be electrically coupled such that the bases of the upwardly facing contacts are connected to the bases of the downwardly facing contacts. The contacts may be configured such that the distal ends of the upwardly facing and downwardly facing electrical contacts are aligned in a direction orthogonal to one or both surfaces of the interposer. In such a configuration, as the density is limited by the area of the sheet needed to form one contact rather than two, higher density of contacts is enabled.

FIG. 6 shows an isometric view of an illustrative interposer, in accordance with some embodiments. In the illustrated example, contacts of interposer 422 are made from two sheets of conductive, compliant material, such as aluminum, copper, or another suitable metal. In some embodiments, the sheet may be a metal alloy such as phosphor bronze or stainless steel, and/or may have layers of different materials, such as a copper alloy with a gold or silver plating. Electrical contacts 424 may be stamped from the first sheet of conductive metal such that they are distributed in a spaced configuration. Electrical contacts 426 may be stamped from the second sheet of conductive metal such that they are distributed in the same spaced configuration.

Electrical contacts 424 and electrical contacts 426 may be electrically coupled such that electrical contacts 424 point away from electrical contacts 426. For example, the contacts may be bonded using a laser welding process, a conductive adhesive, or another suitable method. In some embodiments, the contacts may be metallurgically bonded. Such a bond may be formed between the contacts or may be the result of a braze of material coating the contacts.

When midboard cable termination assembly 102 is mounted on interposer 422, electrical contacts 424 may point towards midboard cable termination assembly 102, and at least a portion of electrical contacts 424 may be in electrical contact with pads on a surface of paddle board 206. In the same example, electrical contacts 426 may point away from midboard cable termination assembly 102, and e.g., toward pads on a printed circuit board, which may be coupled to signal traces within the printed circuit board.

Interposer 422 may include pillars 428 for orienting interposer 422 with respect to a mounting component, such as frame 204. For example, pillars 428 may fit with one or more openings in frame 204 for alignment of interposer 422 and frame 204.

Interposer 422 may have first surface 602, from which electrical contacts 424 extend upwards (in a direction away from a surface of a printed circuit board to which the interposer is mounted, in this example), and second surface 604, from where electrical contacts 426 extend downwards (in a direction toward a surface of a printed circuit board to which the interposer is mounted, in this example). Distal ends 606 of electrical contacts 424 and corresponding distal ends 608 of electrical contacts 426 may be aligned in a direction orthogonal to first surface 602 and second surface 604. In the illustrated example shown in FIG. 6, electrical contacts 424 extend above first surface 602 and electrical contacts 426 extend below second surface 604. In order to maintain the conductive electrical connection from, e.g., midboard cable termination assembly 102 to the printed circuit board substrate, proximal ends 610 of electrical contacts 424 are in electrical contact with corresponding proximal ends 612 of electrical contacts 426.

In some embodiments, a small form factor interposer, such as interposer 422, is manufactured from a first sheet of conductive, compliant material and a second sheet of conductive, compliant material, such as metal. A first set of electrical contacts, such as electrical contacts 424, is stamped from the first sheet such that they are distributed in a particular pattern. A second set of electrical contacts, such as electrical contacts 426, is stamped from the second sheet such that they are distributed in the same pattern. The first set of electrical contacts and the second set of electrical contacts are electrically coupled such that the first set of electrical contacts points away from the second set of electrical contacts. For example, contacts of the first sheet and contacts of the second sheet may be fused using a laser welding process, a conductive adhesive, or another suitable method. FIGS. 10A and 10B show two illustrative sheets of metal in different stages of manufacture of an interposer.

Figure 7:
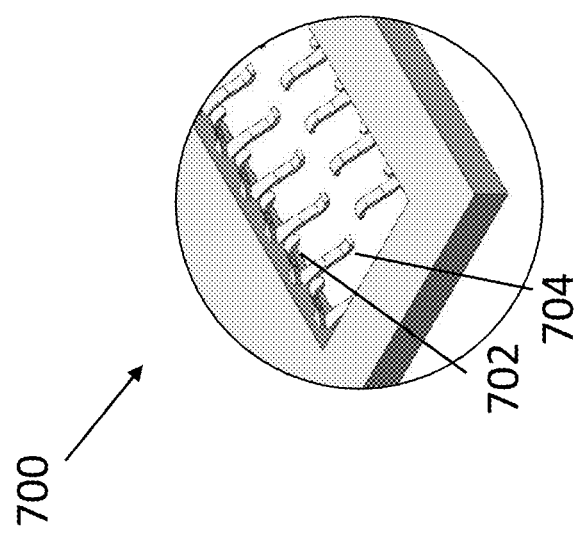
FIG. 7 is an enlarged view of a portion of an illustrative interposer, in accordance with some embodiments.
Figure 15:
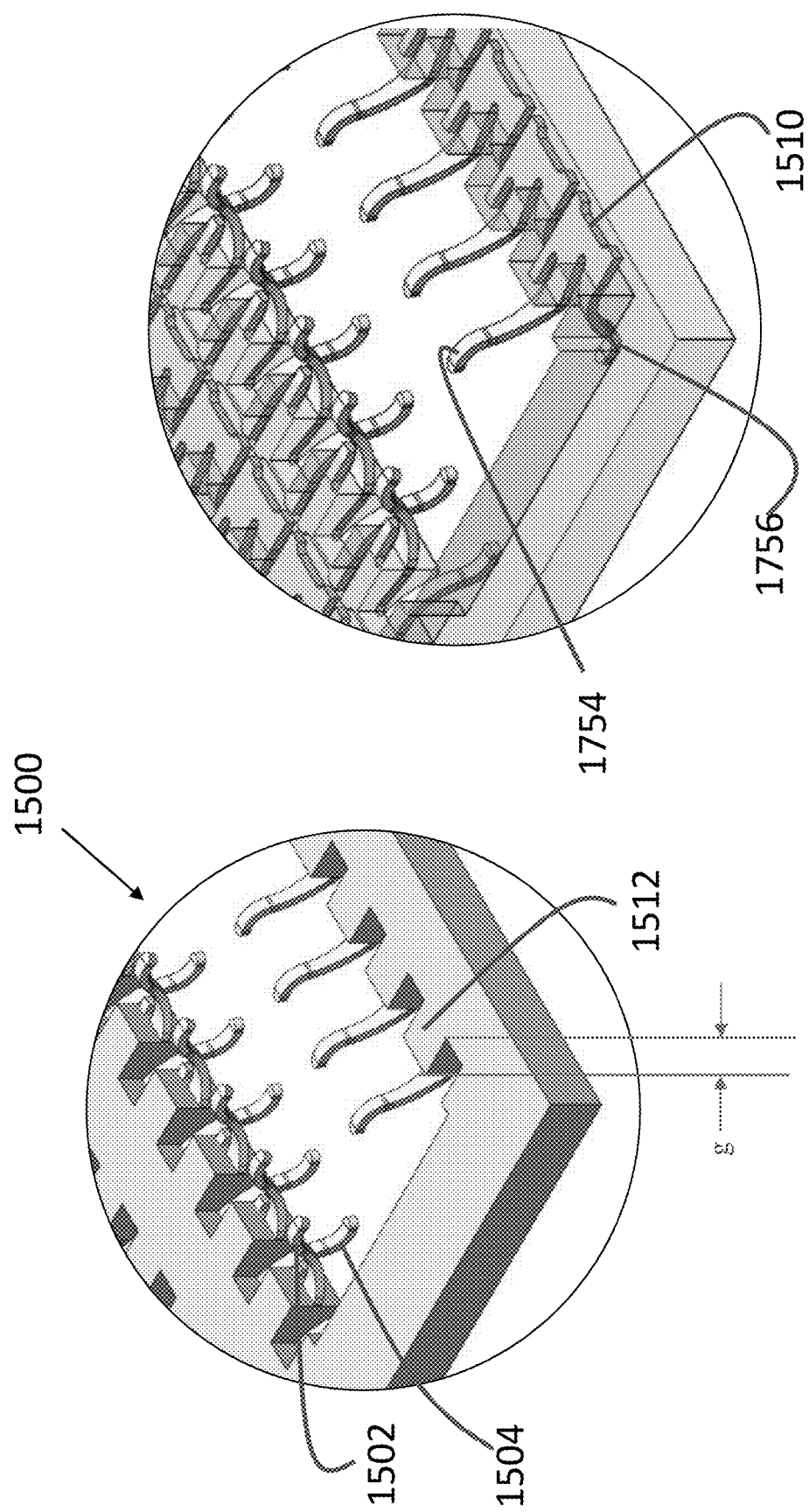
FIG. 15A is an enlarged view of a portion of an illustrative interposer, in accordance with some embodiments.
FIG. 15B is an enlarged view of a portion of an illustrative interposer, with an insulative housing shown partially transparent, in accordance with some embodiments.
Figure 16:
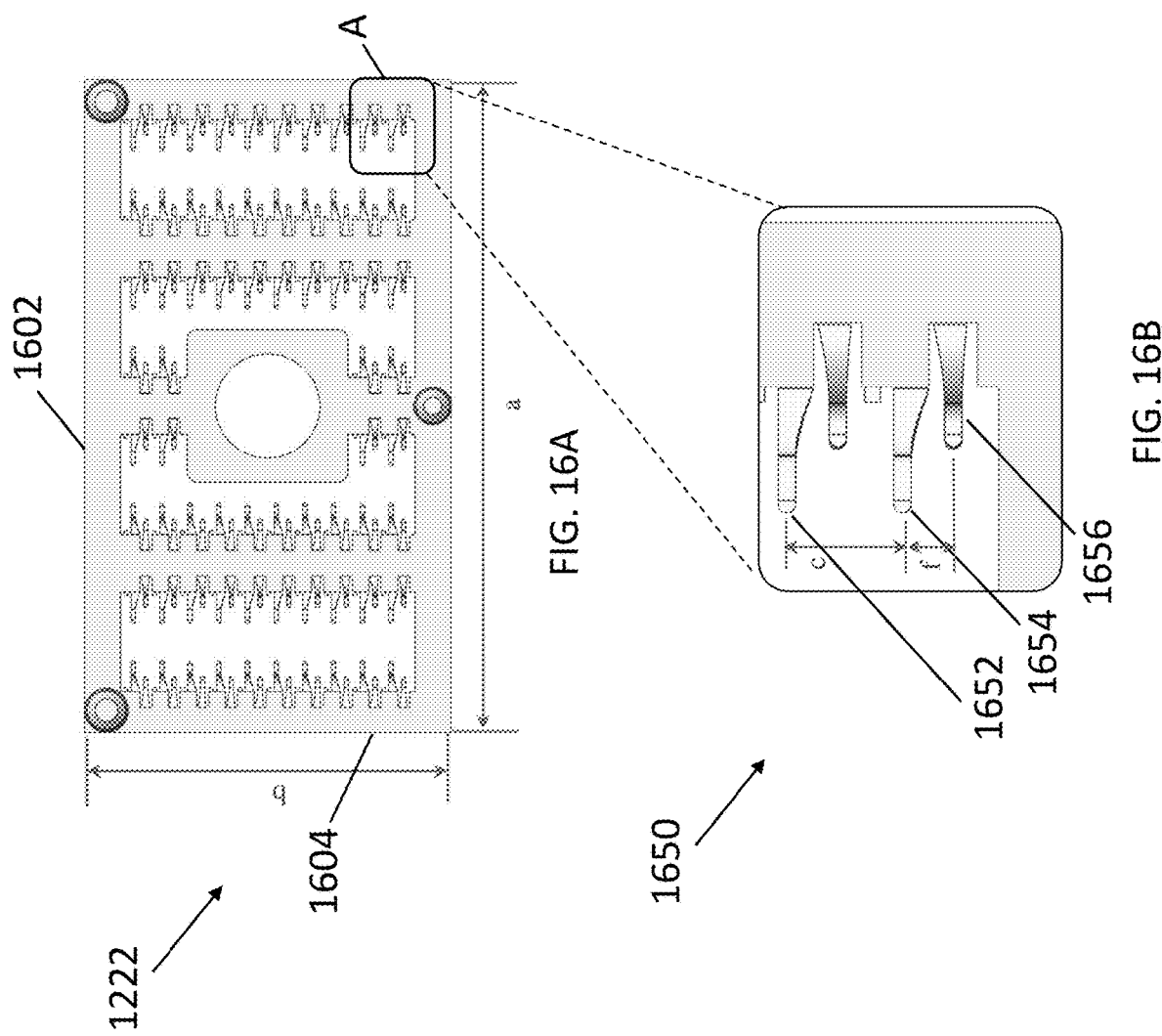
FIG. 16A is a plan view of an illustrative interposer, in accordance with some embodiments.
FIG. 16B is an enlarged view of a portion of the illustrative interposer of FIG. 16A within box A, in accordance with some embodiments.
Figure 17:
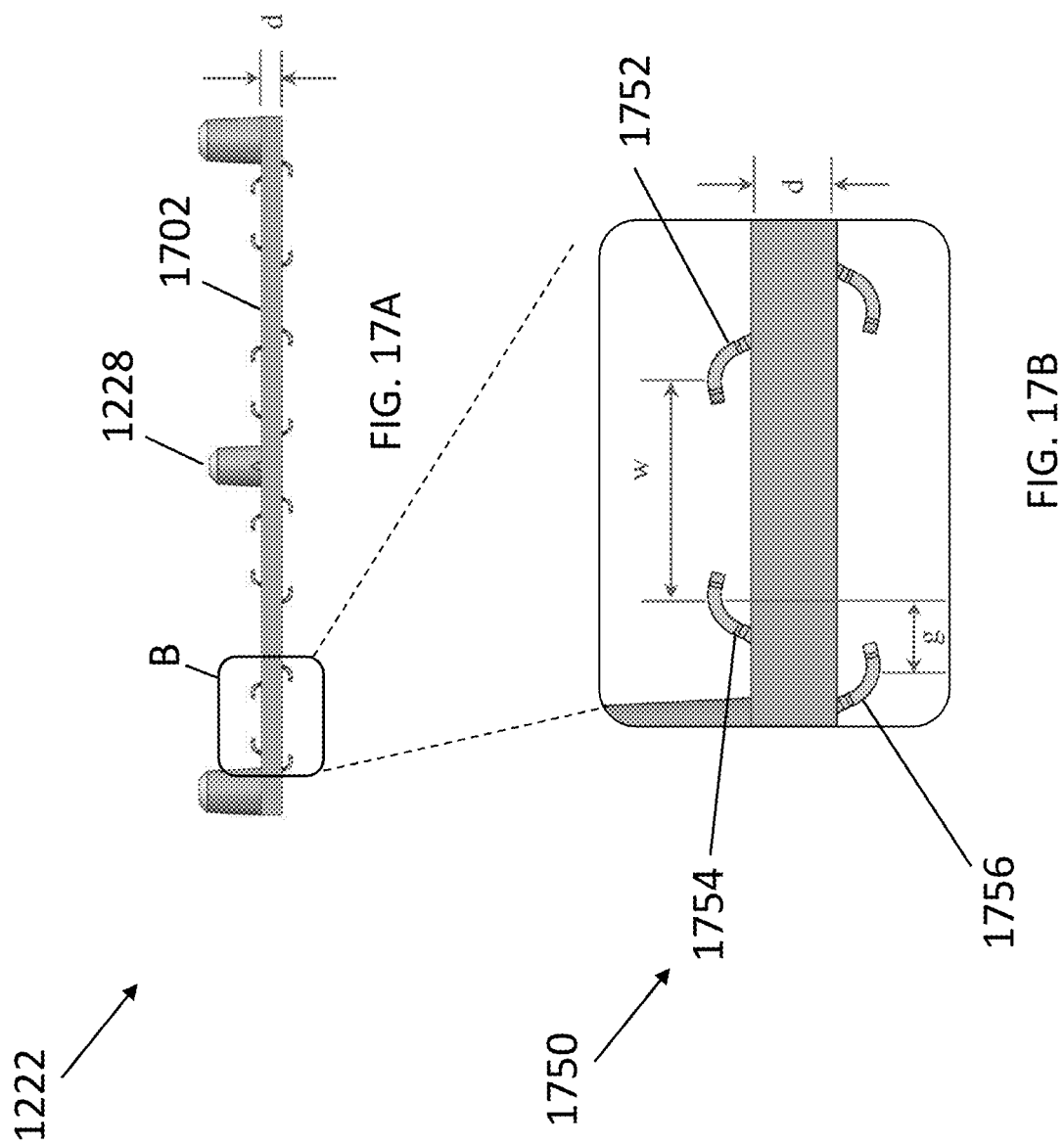
FIG. 17A is a side view of an illustrative interposer, in accordance with some embodiments.
FIG. 17B is an enlarged view of the illustrative interposer of FIG. 17A within box B, in accordance with some embodiments.

FIG. 7 shows enlarged view 700 of a portion of an illustrative interposer, in accordance with some embodiments. In the illustrated example, a portion of an interposer is shown. Electrical contact 702 and electrical contact 704 are positioned in the interposer such that their contact surfaces point away from each other. Electrical contact 702 may be formed from a first sheet of conductive metal, while electrical contact 704 may be formed from a second sheet of conductive metal. The proximal ends of electrical contact 702 and electrical contact 704 may be in electrical contact, and the distal ends of electrical contact 702 and electrical contact 704 may be aligned in a direction orthogonal to the surface of the first sheet and/or the second sheet. When in an interposer positioned adjacent the surface of a printed circuit board, they will also be aligned in a direction orthogonal to the surface of the printed circuit board. The two contacts together are above an area of the printed circuit board that is no greater than the area of a single one of the contacts. Such an arrangement using two sheets may allow for a higher density of electrical contacts to be formed compared to the density of electrical contacts formed in a single sheet, as described with respect to FIG. 15.

FIG. 8A shows plan view 800 of an interposer, in accordance with some embodiments. The interposer includes electrical contacts and an insulative body partially or fully encapsulating bases of the electrical contacts to hold the electrical contacts with a desired spacing. The insulative body may also include one or more pillars for orienting the placement of the interposer with respect to a mounting component, such as frame 204. For example, the pillars may fit with one or more openings in the mounting component for alignment of the interposer and the mounting component. In the illustrated example, interposer 422 has long edge 802 of length, a, and short edge 804 of length, b. The length, a, of long edge 802 is 13.70 mm in some embodiments, less than 20 mm in some embodiments, less than 15 mm in some embodiments, less than 10 mm in some embodiments, or less than 5 mm in some embodiments. The length, b, of short edge 804 is 7.68 mm in some embodiments, less than 15 mm in some embodiments, less than 10 mm in some embodiments, less than 5 mm in some embodiments, or less than 2 mm in some embodiments. Within this area, multiple rows of at least 10 contacts each may be formed. The rows, for example may have up to 12, 16 or 20 contacts in some embodiments. There may by at least 8 such rows. For example, there may be up to 10 rows, 12 rows or up to 16 rows, for example.

FIG. 8B shows enlarged view 850 of a portion of the illustrative interposer of FIG. 8A within box A, in accordance with some embodiments. In the illustrated example, interposer 422 includes electrical contacts arranged in a configuration such that the space between electrical contact 852 and electrical contact 854, adjacent to electrical contact 852, is distance, c. The center-to-center distance, c, between electrical contact 852 and electrical contact 854 is 0.60 mm in some embodiments, less than 1 mm in some embodiments, less than 0.5 mm in some embodiments, or less than 0.2 mm in some embodiments. This spacing applies to both upwardly facing and downwardly facing contacts, as those contacts are aligned.

FIG. 9A shows side view 900 of an illustrative interposer, in accordance with some embodiments. In the illustrated example, interposer 422 includes the spring or compressive electrical contacts and insulative body 902 partially or fully encapsulating bases of the electrical contacts to hold the electrical contacts with a desired spacing. Insulative body 902 includes pillars 428 for orienting the placement of interposer 422 with respect to a mounting component, such as frame 204. Insulative body 902 has a thickness, d (excluding any further thickness due to pillars 428). The thickness, d, of insulative body 902 may be less than 1 mm in some embodiments, less than 0.5 mm in some embodiments, less than 0.2 mm in some embodiments, or less than 0.1 mm in some embodiments. As a specific example, the thickness may be approximately 0.40 mm in some embodiments.

FIG. 9B shows enlarged view 950 of the illustrative interposer of FIG. 9A within box B, in accordance with some embodiments. In the illustrated example, interposer 422 includes electrical contacts arranged in a configuration such that the space between electrical contacts 952 and electrical contacts 954, opposite to electrical contacts 952, is distance, w. The distance, w, between electrical contacts 952 and electrical contacts 954 is 1.00 mm in some embodiments, less than 3 mm in some embodiments, less than 2 mm in some embodiments, less than 1 mm in some embodiments, or less than 0.5 mm in some embodiments. In some embodiments, the distance w may not be limited by the construction techniques of the interposer, but may, instead, be based on the spacing of pads of the adjacent rows of contact pads on a printed circuit board to which the interposer makes contact.

FIGS. 10A and 10B illustrate a process of manufacturing an interposer. FIG. 10A is a cross section of portions of two sheets of metal 1010, 1020 in a stage of manufacture of an interposer according to some embodiments. In the configuration shown, upwardly facing contacts 1016 have been stamped from first sheet 1010 and downwardly facing contacts 1018 have been stamped from second sheet 1020. For each of first sheet 1010 and second sheet 1020, portions of the sheet may be left behind after the stamping, creating tie bars 1012, 1014. Tie bars 1012, 1014 may hold contacts of the first sheet and of the second sheet, respectively, together with the desired orientation.

Contacts 1016, 1018 may be electrically coupled such that the bases of upwardly facing contacts 1016 are connected to the bases of downwardly facing contacts 1018. The bases may have broadsides and may be joined broadside to broadside. For example, the bases of contacts 1016, 1018 may be bonded using a laser welding process, a conductive adhesive, or another suitable method. In some embodiments, the contacts may be metallurgically bonded. Such a bond may be formed between the contacts or may be the result of a braze of material coating the contacts. Contacts 1016, 1018 may be configured such that the distal ends of upwardly facing contacts 1016 and downwardly facing contacts 1018 are aligned in a direction orthogonal to one or both surfaces of the interposer. As the density is limited by the amount of material to form one contact in a sheet, higher density of contacts is enabled.

FIG. 10B is a cross section of the portion of the interposer of FIG. 10A in a subsequent stage of manufacture. The joined bases of contacts 1016, 1018 may be fully or partially encapsulated in plastic or other dielectric materials to hold contacts 1016, 1018 with a desired spacing. For example, the joined bases of contacts 1016, 1018 may be overmolded with an insulative material 1030.

Subsequently, tie bars 1012, 1014 may be cut away. FIG. 10B shows a cross section between two adjacent rows of contacts. The tie bars 1012 and 1014 joining those rows are shown cut away. Tie bars joining the contacts in the same rows are similarly cut away such that each contact pair, containing one upwardly facing and one downwardly facing contact, is electrically isolated from other contact pairs within the interposer. In some embodiments, spring force generated by the cantilevered shape of the contacts can generate the required force for making electrical contact with a pad pressed against the interposer, such as when a pad of a paddle card in a midboard cable termination assembly is pressed into the interposer or the interposer is pressed onto a printed circuit board with pads. Such an interposer may have a shorter vertical height than a design in which a single piece of metal is bent to form both the upwardly facing and downwardly facing contacts and deflection of the web between upper and lower contacts generates contact force. The interposer, for example may have a height on the order of 4 mm, or any other heights as described herein.

The density of connections through the interposer may be greater than in conventional interposers. Forming the interposer from two sheets of conductive metal, as described, may allow for a small form factor due to high density of spring or compressive electrical contacts. As the density is limited by the amount of material to form one contact in a sheet, higher density of contacts is enabled.

An interposer as described above may be used in other ways to make connections to the midboard of a printed circuit board. Moreover, interposers of other configurations may be used for making connections between conductive pads on surfaces of components, including in such midboard cable termination assemblies.

Figure 13:
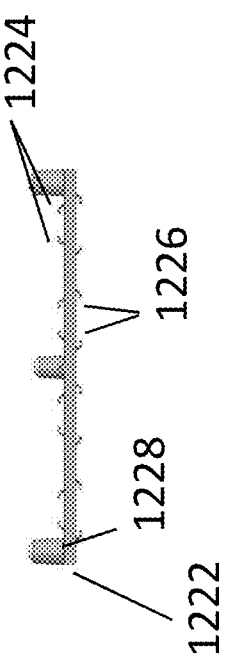
FIG. 13 is a side view, partially exploded, of an illustrative embodiment of an interposer, in accordance with some embodiments.
Figure 12:
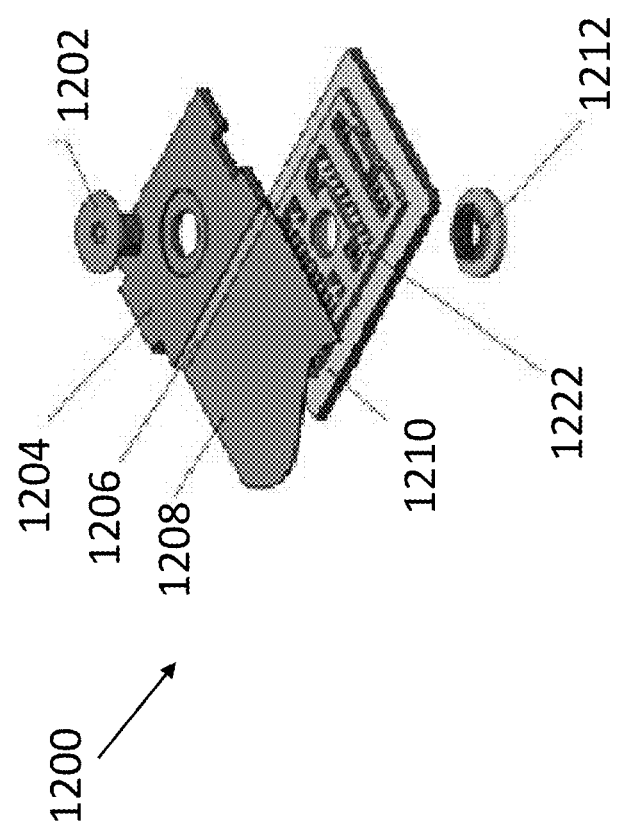
FIG. 12 is a perspective view of an illustrative midboard cable termination assembly in a partially assembled state, in accordance with some embodiments.

FIG. 12 shows a side view 1200 of an illustrative midboard termination assembly, partially exploded, in accordance with some embodiments. FIG. 13 is a side view of an embodiment of an interposer 1222 that may be used in the assembly of FIG. 12 or any other suitable application.

In the illustrated example of FIG. 12, signals may be routed to or from a midboard portion of printed circuit board 1210 using a flexible printed circuit board 1208. In contrast to printed circuit board 1210, which may be a rigid printed circuit board with conductive traces held within a rigid matrix, flexible printed circuit board 1208 may have signal traces held in or disposed on a flexible substrate, such as a polyimide film. Interposer 1222 is shown between rigid printed circuit board 1210 and flexible printed circuit board 1208. Mechanical components may press rigid printed circuit board 1210 and flexible printed circuit board 1208 together, compressing electrical contacts of interposer 1222 against pads on the surfaces of each of rigid printed circuit board 1210 and flexible printed circuit board 1208, acting as a dual compression connector between those components.

In the embodiment, illustrated, a force pressing rigid printed circuit board 1210 and flexible printed circuit board 1208 together may be generated by components such as bolt 1202 and nut 1212. When the midboard termination assembly is assembled, interposer 1222 is aligned with pads on an upper surface of printed circuit board 1210 and pads on a lower surface of flexible printed circuit board 1208. A plate 1204, which may be made of a rigid material such as metal, may overlay the end of flexible printed circuit board 1208 aligned with interposer 1222. A hole may pass through plate 1204, flexible printed circuit board 1208, interposer 1222 and printed circuit board 1210. Bolt 1202 may pass through that hole and nut 1212 may be attached to bolt 1202 at the lower surface of printed circuit board 1210.

Tightening nut 1212 onto bolt 1202 generates compressive force that completes electrical connections between printed circuit board 1210 and pads and flexible printed circuit board 1208. In the illustrated embodiment, a compliant underlayment 1206 may be between flexible printed circuit board 1208 and plate 1204. Compliant underlayment 1206 may accommodate variations in thickness of either flexible printed circuit board 1208 or plate 1204, so as to avoid localized regions of high pressure when nut 1212 is tightened.

FIG. 13 illustrates an embodiment of interposer 1222. Interposer 1222 is shown with compliant electrical contacts extending from opposing surfaces of the interposer. Electrical contacts 1224 extend from an upper surface. In the embodiment of FIG. 12, electrical contacts 1224 may extend towards pads on flexible printed circuit board 1208. Electrical contacts 1226 may extend from a lower surface of interposer 1222. In the embodiment of FIG. 12, they extend toward pads on a surface of printed circuit board 1210 to which the assembly is mounted such that electrical connections may be made to signal traces within the printed circuit board. Pairs of contacts extending in opposite directions from interposer 1222 may be electrically connected within interposer 1222 such that connections may be made between flexible printed circuit board 1208, and printed circuit board 1210, which is here a rigid printed circuit board.

Interposer 1222 may include pillars 1228 for orienting interposer 1222 with respect to flexible printed circuit board 1208. It should be appreciated that pillars or other alignment features may alternatively or additionally extend from a lower surface of interposer 1222 to align interposer 1222 with printed circuit board 1210. Pillars 1228 may fit within or pass through one or more openings in flexible printed circuit board 1208 for alignment of interposer 1222 and flexible printed circuit board 1208.

Interposers, as described herein, provide for compact midboard termination assemblies. The height from a top surface of plate 1204 to a surface of the substrate on which interposer 1222 is mounted, such as a printed circuit board 1210, may be low, such as 5.55 mm in some embodiments, less than 10 mm in some embodiments, less than 5 mm in some embodiments, less than 2 mm in some embodiments, or within the range of 3.5 to 6 mm in some embodiments. Dual compression connectors, which may be attached without solder, which entails high heat that could distort components, enable components with such small dimensions to be used reliably. Further details regarding interposer 1222 are described with respect to FIGS. 14-17 below.

The inventors have recognized and appreciated techniques for manufacturing such low profile interposers as illustrated in FIG. 12. In some interposers, both upwardly facing contacts 1224 and downward facing contacts 1226 may be formed from a single sheet of conductive metal. Therefore an upwardly facing contact and a downwardly facing contact, and a metal web joining them, may be stamped from the same sheet. The electrical contacts may be formed adjacent to one another in the single sheet such that their proximal ends are electrically connected and may also be mechanically connected.

Figure 14:
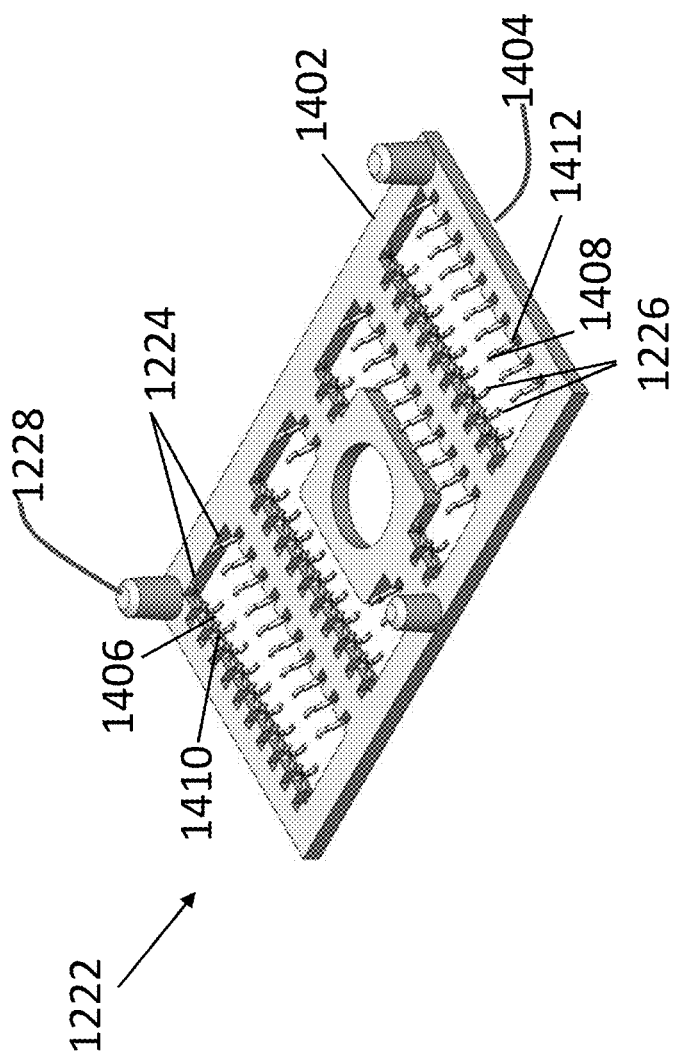
FIG. 14 is an isometric view of an illustrative interposer, in accordance with some embodiments.

FIG. 14 shows an isometric view of interposer 1222, in accordance with some embodiments. In the illustrated example, contacts of interposer 1222 are made from a sheet of conductive, compliant material, such as a metal that is suitably conductive and compliant. In some embodiments, the sheet may be a metal alloy such as phosphor bronze or stainless steel, and/or may have layers of different materials, such as a copper alloy with a gold or silver plating. Electrical contacts 1224 and electrical contacts 1226 may be stamped from the sheet of conductive metal such that they are distributed in a spaced configuration. Electrical contacts 1224 and electrical contacts 1226 may be electrically coupled such that electrical contacts 1224 point away from electrical contacts 1226.

Interposer 1222 may include structures, here shown as pillars 1228, for orienting interposer 1222 with respect to another component, such as flexible printed circuit board 1208. For example, pillars 1228 may fit with one or more openings in flexible printed circuit board 1208 for alignment of interposer 1222 with conductive pads on flexible printed circuit board 1208.

Interposer 1222 may have first surface 1402, from which electrical contacts 1224 extend upwards (in a direction away from a surface of a printed circuit board 1210 to which the interposer is mounted, in the example of FIG. 12), and second surface 1404, from where electrical contacts 1226 extend downwards (in a direction toward a surface of a printed circuit board 1210 to which the interposer is mounted, in the example of FIG. 12). Distal ends 1406 of electrical contacts 1224 and corresponding distal ends 1408 of electrical contacts 1226 may be offset in a direction orthogonal to first surface 1402 and second surface 1404. In the illustrated example shown in FIG. 14, which shows an uncompressed state of interposer 1222, electrical contacts 1224 extend above first surface 1402 and electrical contacts 1226 extend below second surface 1404. In order to make a conductive electrical connection from, e.g., flexible printed circuit board 1208 to the printed circuit board 1210, proximal ends 1410 of electrical contacts 1224 are in electrical contact with corresponding proximal ends 1412 of electrical contacts 1226.

In some embodiments, a small form factor interposer, such as interposer 1222, is manufactured from a single sheet of conductive, compliant material, such as metal. An upwardly facing set of electrical contacts and a downwardly facing set of electrical contacts, and a metal web joining them, may be stamped from the same sheet. A first set of electrical contacts, such as electrical contacts 1224, and a second set of electrical contacts, such as electrical contacts 1226, are stamped from the sheet such that they are distributed in a pattern. The first set of electrical contacts and the second set of electrical contacts may be formed adjacent to one another in the single sheet such that their proximal ends are in electrical and mechanical contact. The first set of electrical contacts and the second set of electrical contacts are electrically coupled such that the first set of electrical contacts points away from the second set of electrical contacts.

FIG. 15A shows an enlarged view 1500 of a portion of interposer 1222, in accordance with some embodiments. Electrical contact 1502 may be an upwardly facing contact 1224 and electrical contact 1504 may be a downwardly facing contact 1226 that are formed in the interposer such that they are electrically and mechanically connected. Electrical contact 1502 and electrical contact 1504 may be formed from a single sheet of conductive metal such that electrical contact 1502 and electrical contact 1504 are formed adjacent to each other. When cut from that sheet, electrical contact 1502 and electrical contact 1504 may remain joined by a web. While the proximal ends of electrical contact 1502 and electrical contact 1504 may be in electrical contact through that web, the distal ends of electrical contact 1502 and electrical contact 1504 are offset in a direction orthogonal to the surface of the single sheet. In some embodiments, such an arrangement using a single sheet may result in a lower density of electrical contacts compared to the density of electrical contacts formed using two sheets, as described with respect to FIG. 7, because one connection between a paddle card and a printed circuit board requires an area of the sheet at least as large as contacts 1502 and 1504 together—which is about twice the area for the configuration in FIG. 7. However, the area may nonetheless be suitably small for many electronic systems.

In FIG. 15B, the insulative body of the interposer is shown transparent, revealing further structure of the contacts, including a web 1510 electrically and mechanically connecting an upward facing contact and a downward facing contact.

FIG. 16A shows a plan view of interposer 1222, in accordance with some embodiments. The interposer includes electrical contacts and an insulative body partially or fully encapsulating bases of the electrical contacts to hold the electrical contacts with a desired spacing. The insulative body may also include one or more pillars for orienting the placement of the interposer with respect to another component, such as frame 204 or flexible printed circuit board 1208.

In the illustrated example, interposer 1222 has long edge 1602 of length, a, and short edge 1604 of length, b. The length, a, of long edge 1602 is 13.70 mm in some embodiments, less than 20 mm in some embodiments, less than 15 mm in some embodiments, less than 10 mm in some embodiments, or less than 5 mm in some embodiments. The length, b, of short edge 1604 is 7.68 mm in some embodiments, less than 15 mm in some embodiments, less than 10 mm in some embodiments, less than 5 mm in some embodiments, or less than 2 mm in some embodiments. Within this area, multiple rows of at least 10 contacts each may be formed. The rows, for example may have up to 12, 16 or 20 contacts in some embodiments. There may by at least 8 such rows. For example, there may be up to 10 rows, 12 rows or up to 16 rows, for example.

FIG. 16B shows an enlarged view 1650 of a portion of the illustrative interposer of FIG. 16A within box A, in accordance with some embodiments. Electrical contact 1656 may be a downwardly facing contact 1226. Electrical contacts 1652 and 1654 may be upwardly facing contact 1224. Side-by-side upwardly facing and downwardly facing contacts, such as contacts 1654 and 1656 may be electrically and mechanically connected. In the illustrated example, interposer 1222 includes electrical contacts arranged in a configuration such that the spacing between electrical contact 1652 and electrical contact 1654, adjacent to electrical contact 1652, is distance, c. The center-to-center distance, c, between electrical contact 1652 and electrical contact 1654 may be 0.60 mm in some embodiments, less than 1 mm in some embodiments, less than 0.5 mm in some embodiments, or less than 0.2 mm in some embodiments. This spacing applies to both upwardly facing and downwardly facing contacts.

In the embodiment illustrated, the upwardly facing contacts are aligned in rows and the downwardly facing contacts may be aligned in parallel rows. The rows, however, may be offset in a direction along edge 1602. Electrical contact 1654 and electrical contact 1656 are also offset in a direction orthogonal to the surface of interposer 1222 by an offset distance, f. The offset distance, f, between electrical contact 1654 and electrical contact 1656 is 0.27 mm in some embodiments, less than 0.5 mm in some embodiments, less than 0.2 mm in some embodiments, or less than 0.1 mm in some embodiments. In some embodiments, the center-to-center distance c and/or the offset distance f may be determined to maintain a compatible footprint and/or work mechanically with a midboard cable termination assembly or another suitable component disposed on the printed circuit board.

FIG. 17A shows a side view of interposer 1222, in accordance with some embodiments. In the illustrated example, interposer 1222 includes spring or compressive electrical contacts and insulative body 1702 partially or fully encapsulating bases of the electrical contacts to hold the electrical contacts with a desired spacing. Insulative body 1702 includes pillars 1228. Insulative body 1702 has a thickness, d (excluding any further thickness due to pillars 1228). The thickness, d, of insulative body 1702 may be less than 1 mm in some embodiments, less than 0.5 mm in some embodiments, less than 0.2 mm in some embodiments, or less than 0.1 mm in some embodiments. As a specific example, the thickness may be approximately 0.40 mm in some embodiments.

FIG. 17B shows an enlarged view 1750 of the interposer of FIG. 17A within box B, in accordance with some embodiments. In the illustrated example, interposer 1222 includes electrical contacts arranged in a configuration such that the space between upwardly facing electrical contact 1752 and upwardly facing electrical contact 1754, opposite to electrical contact 1752, is distance, w. The distance, w, between electrical contact 1752 and electrical contact 1754 is 1.00 mm in some embodiments, less than 3 mm in some embodiments, less than 2 mm in some embodiments, less than 1 mm in some embodiments, or less than 0.5 mm in some embodiments.

The distance, in a direction parallel to surfaces 1402 and 1404, between the contact surface of an upwardly facing electrical contact 1754 and an adjacent downwardly facing electrical contact 1756 is distance, g. The distance, g, between electrical contact 1754 and electrical contact 1756 is 0.33 mm in some embodiments, less than 0.5 mm in some embodiments, less than 0.2 mm in some embodiments, or less than 0.1 mm in some embodiments. In some embodiments, an elongated member of the insulative body 1702, in which the bases of electrical contacts and the webs joining them are embedded may have castellations 1512 (FIG. 15A). The castellations may have a length, which may also be g, that ensures that the amount of the base of each electrical contact embedded within the insulative body is close enough to being equal that the spring force generated by each electrical contact is equivalent.

In some embodiments, the distance w and/or the distance g may not be limited by the construction techniques of the interposer, but may, instead, be based on the spacing of pads of the adjacent rows of contact pads on a printed circuit board to which the interposer makes contact. In some embodiments, the distance w and/or the distance g may be determined to maintain a compatible footprint and/or work mechanically with a midboard termination assembly or another suitable component disposed on the printed circuit board.

Figure 18:
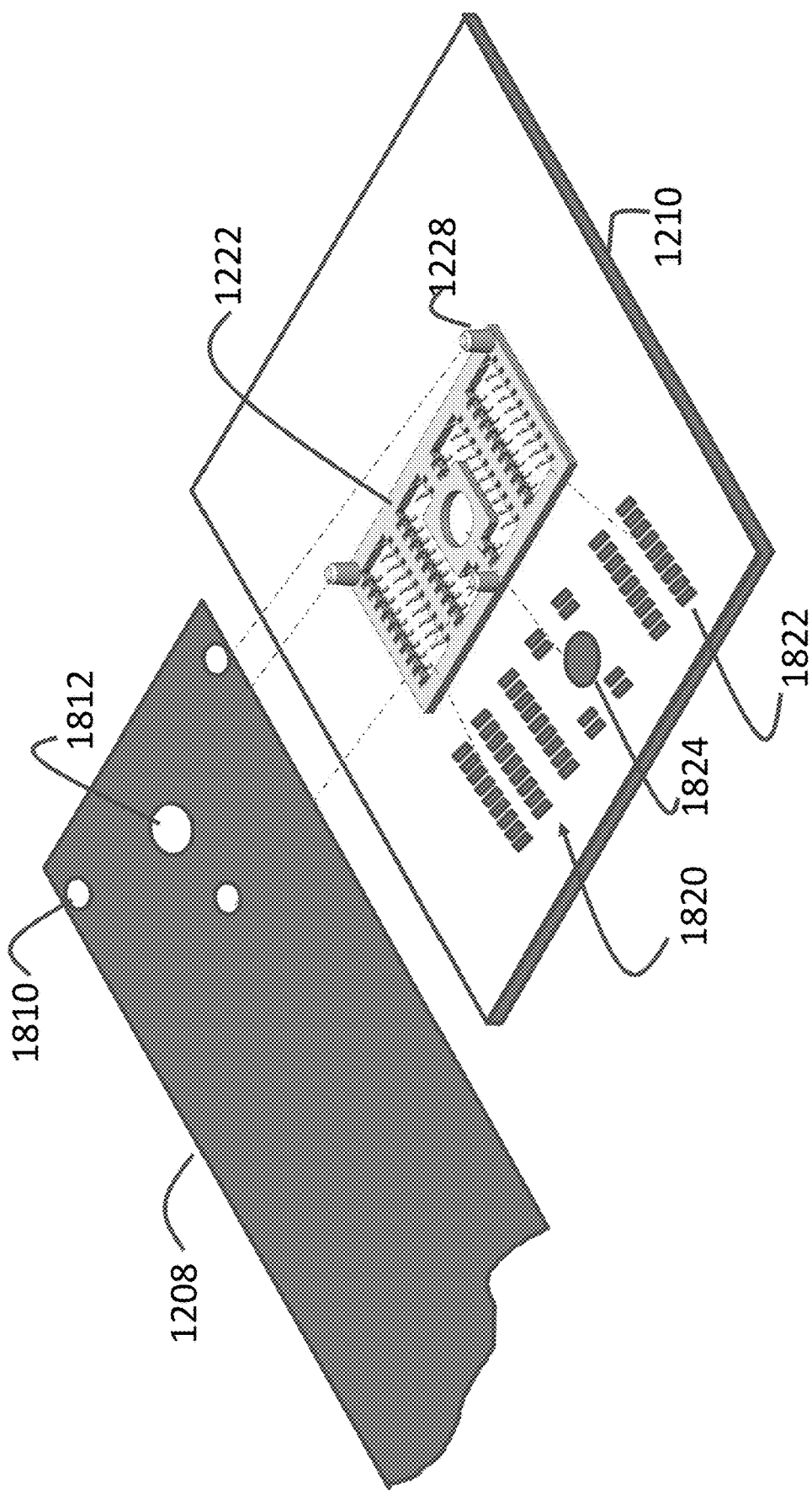
FIG. 18 is a perspective view, of an illustrative midboard cable termination assembly in a partially assembled state, in accordance with some embodiments.

In the pictured embodiments, interposer 1222 may not need to be mounted on either a flexible or rigid printed circuit board using surface-mount or similar technology. In some embodiments, interposer 1222 may be attached to either using a staking process. FIG. 18 illustrates an embodiment in which interposer 1222 is mechanically attached to flexible printed circuit board 1208, forming a cable assembly. That cable assembly may then be pressed against a printed circuit board 1210, using mechanical components, such as bolt 1202 and nut 1212 described above in connection with FIG. 12. That mechanical force can compress electrical contacts on opposing surfaces of interposer 1222 into both flexible printed circuit board 1208 and printed circuit board 1210.

Printed circuit board 1210 may include a connector footprint 1820 on its surface for this purpose. Footprint 1820 includes multiple parallel rows 1822 of conductive pads that make connections to traces or other conductive structures within printed circuit board 1210. The pads may be positioned with the same spacing as the downward facing electrical contacts of interposer 1222. The pads may be spaced with respect to hole 1824 such that, when interposer 1222 is held to printed circuit board 1210 with bolt 1202, the downward facing electrical contacts of interposer 1222 will press against the pads.

Pillars 1228 may align interposer 1222 with flexible printed circuit board 1208 such that upward facing electrical contacts 1224 of interposer 1222 contact pads 1910 (FIG. 19) on flexible printed circuit board 1208. Pillars 1228 may pass through holes 1810 for alignment and/or mechanical attachment of interposer 1222 and flexible printed circuit board 1208. The tops of pillars 1228 may then be modified to prevent them from being withdrawn through holes 1810, thereby securing interposer 1222 to flexible printed circuit board 1208.

Figure 19:
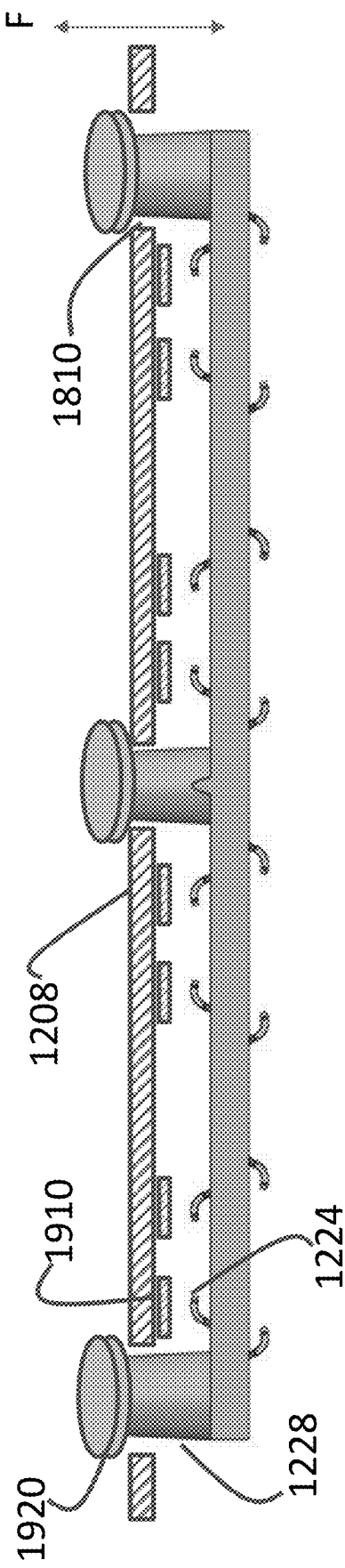
FIG. 19 is a side cross-sectional view, of an interposer staked to a flexible printed circuit board, in accordance with some embodiments.

FIG. 19 illustrates, in cross section, an embodiment in which a staking process alters the tops of pillars 1228 to hold pillars 1228 within holes 1810. The tops have pancaked portions 1920 that are larger than holes 1810. In embodiments in which the insulative body of interposer 1222 is formed of a thermoplastic material, pancaked portions 1920 may be formed by applying sufficient heat to the tops of pillars 1228 to soften the pillars, allowing them to be deformed. A heated tool pressed against pillars 1228 may modify the shapes of pillars 1228 to be as shown without applying so much heat to interposer 1222 that other portions of the insulative body deform, which might occur in a solder reflow operation. Thus, a staking process as illustrated may enable a very thin interposer with less risk of deformation during solder reflow.

FIG. 19 shows that, even after pillars 1228 have been modified with pancaked portions 1920, they may be of sufficient length that flexible printed circuit board 1208 may slide up and down the pillars, allowing "float" in the direction F. In this way, upward facing electrical contacts 1224 need not be compressed upon attachment of interposer 1222 to flexible printed circuit board 1208. Rather, compression may occur when the cable assembly, including flexible printed circuit board 1208 and interposer 1222 are attached to a printed circuit board 1210, such as by bolt 1202 passing through both hole 1812 (FIG. 18) in flexible printed circuit board 1208 and hole 1824 in rigid printed circuit board 1210.

Having thus described several embodiments, it is to be appreciated various alterations, modifications, and improvements may readily occur to those skilled in the art. Such alterations, modifications, and improvements are intended to be within the spirit and scope of the invention.

For example, FIG. 1 illustrates an electronic device in which a midboard cable termination assembly might be used. It should be appreciated that FIG. 1 shows a portion of such a device. For example, board 110 may be larger than illustrated and may contain more components than illustrated. Likewise, board 118 may be larger than illustrated and may contain components. Moreover, multiple boards parallel to board 118 and/or parallel to board 110 may be included in the device.

A midboard cable termination assembly might also be used with board configurations other than the illustrated orthogonal configuration. The midboard cable termination assembly might be used on a printed circuit board connected to another, parallel printed circuit board or might be used in a daughter card that plugs into a backplane at a right angle. As yet another example, the midboard cable termination assembly might be mounted on a backplane.

As yet another example of a possible variation, a midboard cable termination assembly mounted on board 110 is shown with a cable that connects to a connector that is similarly mounted to board 110. That configuration is not, however, a requirement, as the cable may be connected directly to the board, an integrated circuit or other component, even directly to the board 110 to which the midboard cable termination assembly is mounted. As another variation, the cable may be terminated to a different printed circuit board or other substrate. For example, a cable extending from a midboard cable termination assembly mounted to board 110 may be terminated, through a connector or otherwise, to a printed circuit board parallel to board 110.

As yet another example, a paddle card is described as forming a portion of the midboard cable termination assembly. A paddle card may be formed using known printed circuit board manufacturing technology. However, other approaches for forming a suitable structure may be used. A set of leads may stamped from a sheet of metal. Each lead may have a conductive region to which a wire of a cable may be terminated. Another region may be shaped as a pad to make contact with a compliant contact of an interposer. The leads may be held together with plastic molded around them. The plastic may provide surfaces, with the regions for cable on surfaces facing in one direction and pads for contact with an interposer on surfaces facing in another direction.

Further, exemplary materials were described for components of the midboard cable termination assembly. Other materials may be used. For example, the frame and lid of the midboard cable termination assembly may be made of insulative material, such as plastic. Alternatively, some or all of the components may be conductive. The lid, for example, may be conductive and connected to ground so as to provide shielding for the cable terminations. Likewise, the frame may be made conductive and grounded to provide shielding or may be surrounded by a shielding cage.

Also, connections between a cable shield and the ground structure of the midboard cable termination assembly were described to be made via a pad on a surface of the paddle card. In other embodiments, connections may be made to other conductive portions of the assembly.

Further, a thin and high density interposer was described as used in a midboard cable termination assembly. Such an interposer is suitable for other uses. It may be used, for example, to connect a packaged semiconductor device or any other electronic component to a printed circuit board. In such a configuration, a semiconductor device with a Ball Grid Array or Land Grid Array may be connected to the board through the interposer. Alternatively or additionally, the component may be the end of a flexible printed circuit. Accordingly, it should be appreciated that a component with a substrate having contact pads thereon may be pressed against the interposer to make electrical connections.

Further, it is described that compressive force is applied to an interposer as a result of a lid being closed with some mechanism to bias the lid towards the interposer. That mechanism was described as spring-like members with camming surfaces formed as part of the frame. Similar spring-like members may be formed as part of a sheet-metal shell surrounding the frame and/or the interposer.

Moreover, as described, the lid was mechanically coupled to a frame that was secured to a printed circuit board. In alternative embodiments, the interposer may be secured to the printed circuit board directly, without a frame. For example, a screw may pass through the interposer, and one or both of the components connected by the interposer. Rotating the screw may draw those two components together, creating the compressive force on the interposer that electrically connects the components.

Terms signifying direction, such as "upwards" and "downwards," were used in connection with some embodiments. These terms were used to signify direction based on the orientation of components illustrated or connection to another component, such as a surface of a printed circuit board to which a termination assembly is mounted. It should be understood that electronic components may be used in any suitable orientation. Accordingly, terms of direction should be understood to be relative, rather than fixed to a coordinate system perceived as unchanging, such as the earth's surface.

Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein are for the purpose of description and should not be regarded as limiting. The use of "including," "comprising," "having," "containing," or "involving," and variations thereof herein, is meant to encompass the items listed thereafter (or equivalents thereof) and/or as additional items.

What is claimed is:

1. An interposer, comprising:
    a first plurality of electrical contacts formed in a first sheet, the first plurality of electrical contacts comprising a corresponding first plurality of bases, each of the first plurality of bases comprising opposing edges and opposing broadsides connecting the opposing edges; and
    a second plurality of electrical contacts formed in a second sheet, the second plurality of electrical contacts comprising a corresponding second plurality of bases, each of the second plurality of bases comprising opposing edges and opposing broadsides connecting the opposing edges,
    wherein respective ones of the first plurality of bases formed in the first sheet and the second plurality of bases formed in the second sheet are electrically coupled with broadsides of the first plurality of bases parallel to and aligned with broadsides of the second plurality of bases such that the first plurality of electrical contacts points away from the second plurality of electrical contacts,
    wherein the respective ones of the first plurality of bases and the second plurality of bases comprise a welded portion joining them at their broadsides.

2. The interposer of claim 1, wherein the first plurality of bases and the second plurality of bases are fully or partially encapsulated in a dielectric material to hold the first plurality of electrical contacts and the second plurality of electrical contacts with a desired spacing.

3. The interposer of claim 1, wherein the interposer has a first surface and a second surface, and wherein distal ends of the first plurality of electrical contacts and corresponding distal ends of the second plurality of electrical contacts are aligned in a direction orthogonal to the first surface and the second surface.

4. The interposer of claim 3, wherein the first plurality of electrical contacts extends above the first surface and the second plurality of electrical contacts extends below the second surface.

5. The interposer of claim 1, wherein proximal ends of the first plurality of electrical contacts are in contact with corresponding proximal ends of the second plurality of electrical contacts.

6. The interposer of claim 1, wherein the first plurality of bases and the second plurality of bases are fused using a laser welding process.

7. The interposer of claim 1, wherein the first plurality of bases and the second plurality of bases are fused using a conductive adhesive.

8. The interposer of claim 1, wherein a long edge of the interposer is within a range of 1 mm and 20 mm, a short edge of the interposer is within a range of 1 mm and 15 mm, and an area of the interposer is within a range of 1 mm2 and 300 mm2.

9. The interposer of claim 1, wherein a surface is configured for mounting adjacent a printed circuit board, and wherein a thickness of the interposer in a direction perpendicular to the surface is approximately 0.40 mm.

10. An electronic assembly, comprising:
    a first printed circuit board comprising a first surface and a first plurality of conductive pads thereon;
    a second printed circuit board comprising a second surface and a second plurality of conductive pads thereon, wherein the second surface faces the first surface; and
    an interposer between the first printed circuit board and the second printed circuit board, wherein the interposer comprises:
        a first plurality of electrical contacts formed in a first sheet, the first plurality of electrical contacts comprising a corresponding first plurality of bases, each of the first plurality of bases comprising opposing edges and opposing broadsides connecting the opposing edges; and a second plurality of electrical contacts formed in a second sheet, the second plurality of electrical contacts comprising a corresponding second plurality of bases, each of the second plurality of bases comprising opposing edges and opposing broadsides connecting the opposing edges, wherein respective ones of the first plurality of bases formed in the first sheet and the second plurality of bases formed in the second sheet are electrically coupled with broadsides of the first plurality of bases parallel to and aligned with broadsides of the second plurality of bases such that the first plurality of electrical contacts points away from the second plurality of electrical contacts, and wherein the respective ones of the first plurality of bases and the second plurality of bases comprise a welded portion joining them at their broadsides.

11. The electronic assembly of claim 10, wherein the second printed circuit board is a paddle card with a plurality of cables terminated thereto.

12. The electronic assembly of claim 10, wherein:

the interposer further comprises an insulative member comprising a first surface facing the first surface of the first printed circuit board and a second surface facing the second surface of the second printed circuit board, wherein the insulative member comprises a hole;

the insulative member of the interposer has a thickness, in a direction perpendicular to the first surface of the first printed circuit board of less than 6 mm; and the first plurality of electrical contacts and the second plurality of electrical contacts are disposed in a plurality of parallel rows with contact spacing of 0.9 mm or less along each row.

13. The interposer of claim 10, wherein the interposer has a first surface and a second surface, and wherein distal ends of the first plurality of electrical contacts and corresponding distal ends of the second plurality of electrical contacts are offset in a direction orthogonal to the first surface and the second surface.

14. The interposer of claim 13, wherein the first plurality of electrical contacts extends above the first surface and the second plurality of electrical contacts extends below the second surface.

15. The interposer of claim 10, wherein a long edge of the interposer is within a range of 1 mm and 20 mm, a short edge of the interposer is within a range of 1 mm and 15 mm, and an area of the interposer is within a range of 1 $mm^2$ and 300 $mm^2$.

16. The interposer of claim 10, wherein a thickness of the interposer in a direction perpendicular to the first surface is approximately 0.40 mm.

17. The interposer of claim 10, wherein the first printed circuit board is a flexible printed circuit board and the second printed circuit board is a rigid printed circuit board;

wherein the interposer is disposed between the flexible printed circuit board and the rigid printed circuit board so as to comprise a dual compression connector between the flexible printed circuit board and the rigid printed circuit board.

18. The interposer of claim 17, wherein attachment of the interposer to the rigid printed circuit board is solder free.

19. The interposer of claim 17, wherein the interposer is staked to the flexible printed circuit board.

20. The interposer of claim 19, wherein the interposer is staked to the flexible printed circuit board to enable float between the interposer and the flexible printed circuit board.

* * * * *